United States Patent
Noda

(10) Patent No.: US 10,382,076 B2
(45) Date of Patent: Aug. 13, 2019

(54) ANTENNA DEVICE AND MEASUREMENT METHOD

(71) Applicant: ANRITSU CORPORATION, Atsugi-shi (JP)

(72) Inventor: Hanako Noda, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 0 days.

(21) Appl. No.: 16/153,372

(22) Filed: Oct. 5, 2018

(65) Prior Publication Data
US 2019/0115941 A1    Apr. 18, 2019

(30) Foreign Application Priority Data

Oct. 13, 2017    (JP) .................................. 2017-199389
Oct. 30, 2017    (JP) .................................. 2017-209123

(51) Int. Cl.
*H04B 1/04*    (2006.01)
*H01Q 21/00*   (2006.01)

(52) U.S. Cl.
CPC ........... *H04B 1/0475* (2013.01); *H01Q 21/00* (2013.01)

(58) Field of Classification Search
CPC .......... H04B 1/0475; H04B 3/04; H04B 3/14; H04B 5/00; H04B 17/00; H04B 40/18; H04L 27/38; H01Q 3/242; H01Q 21/00; H01Q 21/30
See application file for complete search history.

(56) References Cited

U.S. PATENT DOCUMENTS

| 4,041,496 A | * | 8/1977 | Norris ..................... H01Q 3/242 342/368 |
| 9,787,336 B1 | * | 10/2017 | Cova .................... H04B 1/0475 |
| 2008/0285684 A1 | * | 11/2008 | Shen ....................... H04L 27/38 375/324 |
| 2011/0115666 A1 | * | 5/2011 | Feigin ..................... G01S 7/023 342/22 |

FOREIGN PATENT DOCUMENTS

JP          2017181070 A    10/2017

* cited by examiner

*Primary Examiner* — Thanh C Le
(74) *Attorney, Agent, or Firm* — Greer Burns & Crain, Ltd.

(57) ABSTRACT

Provided is an antenna device used for evaluating a transmission characteristic or a reception characteristic of equipment under test (EUT) having an array antenna that includes a plurality of antenna elements arranged in a plane at predetermined intervals. The antenna device includes an antenna for receiving a modulated signal radiated by the EUT via the array antenna or radiating a modulated signal to the array antenna. The antenna is disposed at a position on a z-axis perpendicular to the plane defined by the plurality of antenna elements such that a group delay distortion of the modulated signal is reduced in a near-field region.

20 Claims, 32 Drawing Sheets

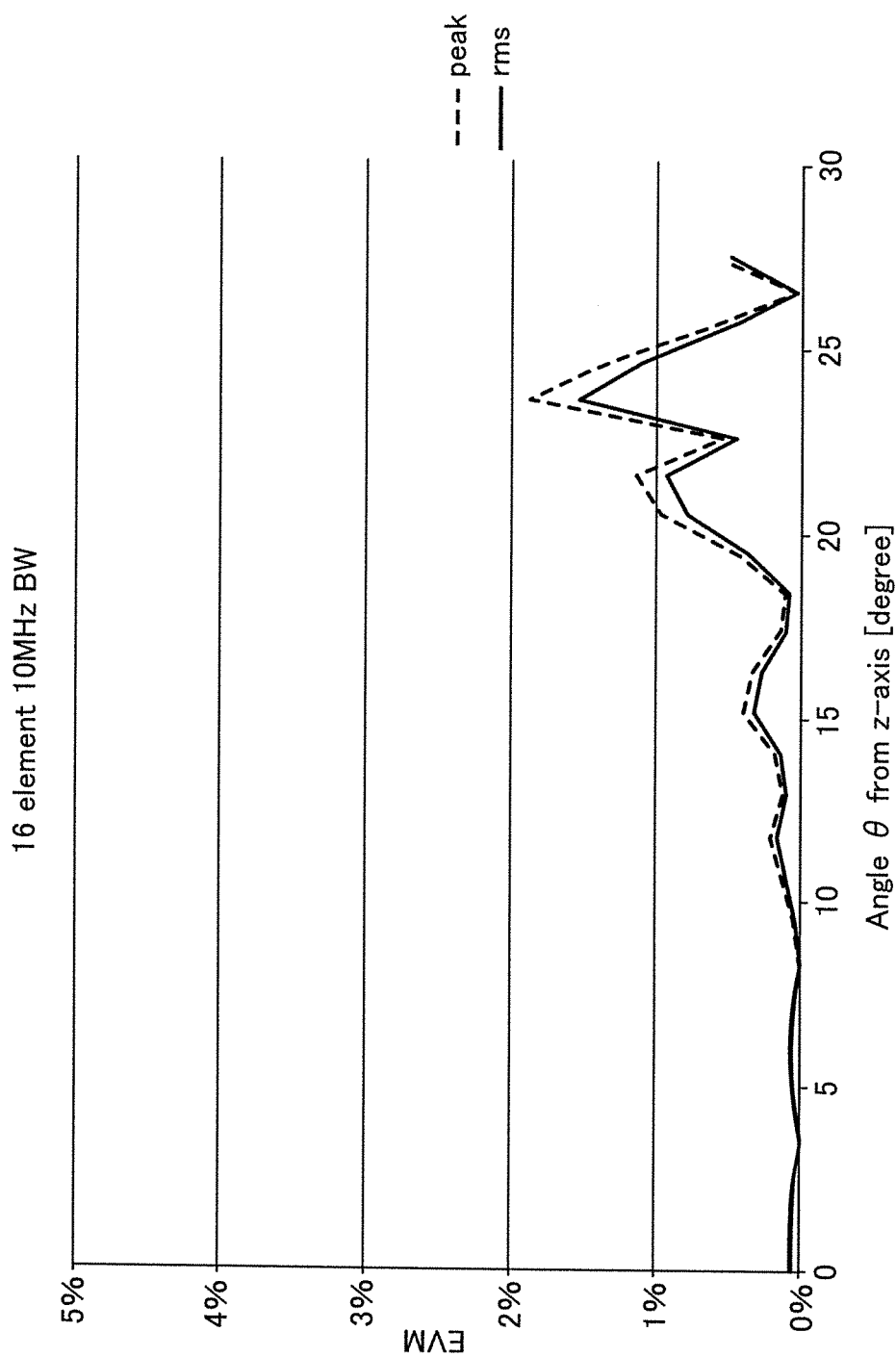

ANTENNA DEVICE AND MEASUREMENT METHOD

CROSS-REFERENCE TO RELATED APPLICATIONS

This application is based upon and claims priority from prior Japanese Patent Application No. 2017-199389 filed Oct. 13, 2017 and Japanese Patent Application No. 2017-209123 filed October 30, 2017, the entire contents of which are incorporated herein by reference.

BACKGROUND OF THE INVENTION

1. Field of the Invention

The present invention relates to antenna devices and measurement methods.

2. Description of Related Art

In base stations corresponding to Massive MIMO and beamforming, the use of a large-scale array antenna having many antenna elements arranged in a lattice pattern has been considered. Specifically, the number of the antenna elements is 16×16, 64×64, or the like.

It is difficult for such a millimeter wave bandwidth large-scale array antenna to measure only the antenna separately from an RF circuit used for transmission and reception, thus, the establishment of technology for measuring the excitation state of the array antenna by measuring a signal propagating in the atmosphere has been desired.

Further, it is difficult for such a large-scale array antenna used in a millimeter wave bandwidth to measure the performance of a transmitter-receiver system separately from an RF circuit used for transmission and reception, thus, the establishment of technology for evaluating the performance, such as reception sensitivity, of the receiver system by supplying a signal propagating in the atmosphere has been desired.

CITED DOCUMENTS

Patent Document

Japanese Patent Application No. 2016-63628

SUMMARY OF THE INVENTION

Technical Problem

In evaluations of the transmission and reception performance in which a transmitter-receiver system having an antenna to be measured which cannot be detached from the transmitter-receiver is the equipment under test (EUT), conventionally, near-field measurements have been used in directivity evaluations which are one item of transmission evaluations. When far-field directivity is determined by the near-field measurement, a plane is about 3λ apart from the antenna to be measured is usually scanned with a probe antenna. Here, λ is a wavelength determined from a frequency of a transmission signal. This is because if the distance from the antenna to be measured is short, multiple reflections between the antenna to be measured and the probe antenna affect the measurement results, and if the distance from the antenna to be measured is long, a signal transmitted from the antenna to be measured is attenuated, so that the measurement results are affected by noise.

With respect to the evaluation of the transmitter performance of the transmitter and receiver performances of the EUT, not only the directivity of a transmission signal but also measurement of an EVM (Error Vector Magnitude), which indicates modulation accuracy, is required for the evaluation. However, any measurement method in a near field has not been established except for the directivity of the transmission signal. Therefore, the EVM has to be measured in a far field where the measurement is affected by noise due to level attenuation. Further, as to the reception evaluation of the EUT, it is also required to evaluate a reception sensitivity when the EUT receives a signal. However, any measurement method in the near field has not been established except for the directivity of the transmission signal. Also, in the case of the reception evaluation as mentioned above regarding the transmission evaluation, an antenna to be measured is united with a receiver in the EUT, thus, the antenna cannot be detached for measurement. Therefore, the reception sensitivity of the EUT has to be determined by measuring a signal radiated from the far field.

For example, when an array of antenna elements is 4 rows×4 columns, the distance of the far field from the array antenna is 8λ, and when the array is 16 rows×16 columns, the distance of the far field from the array antenna is 128λ, where the element intervals are λ/2. This corresponds to about 1.4 m at 28 GHz, and corresponds to 12.8 m at 3 GHz in the case of 16 rows×16 columns. In this way, depending on the frequency, the probe antenna must be located far from the antenna to be measured. In the measurement in the far field where the probe antenna is located far from the antenna to be measured, the measurement uncertainty of the EVM increases due to the influence of noise caused by the attenuation of a power level of a transmission signal. Also, in the evaluation of the reception performance of the EUT, similarly to the evaluation of the transmission performance, a transmission probe antenna for radiating a signal to the EUT must be located far from the EUT depending on the frequency.

Further, the distance between the EUT having the antenna to be measured and the probe antenna used for transmission or reception is increased in the far-field measurement compared with the near-field measurement. Therefore, a large anechoic box or chamber is required for covering the EUT and the probe antenna for transmission and reception, which causes a problem that the measurement system becomes large.

On the other hand, when the EVM of a signal radiated from the entire antenna elements of the antenna to be measured of the transmitter is measured in the near field, the signal to be measured is a modulated signal having a certain bandwidth. Therefore, there is also a problem that the value of the EVM increases due to the influence of the group delay caused by the bandwidth of the modulated signal. Also, in the evaluation of the reception performance of the EUT, similarly to the evaluation of the transmission performance, when the reception sensitivity is measured in the near field, a signal to be measured is a modulated signal having a certain bandwidth. Therefore, there is also a problem that the reception sensitivity is deteriorated due to the influence of the group delay caused by the bandwidth of the modulated signal.

Solution to Problem

The present invention has been made in view of these problems. An object of the present invention is to provide an antenna device and a measurement method which make it possible to measure an EVM in addition to a directivity in a near field and/or measure a reception sensitivity of an EUT in the near field for evaluating the transmission and reception performances of the EUT.

In order to achieve the above object, according to one aspect of the present invention, there is provided an antenna device used for evaluating a transmission characteristic or a reception characteristic of equipment under test (EUT) having an array antenna that comprises a plurality of antenna elements arranged in a plane at predetermined intervals, the antenna device including an antenna for receiving a modulated signal radiated by the EUT via the array antenna or radiating the modulated signal to the array antenna, wherein the antenna is disposed at a position on a z-axis perpendicular to the plane defined by the plurality of antenna elements such that a group delay distortion of the modulated signal is reduced in a near-field region.

With this configuration, it is possible to measure transmission characteristics and reception characteristics of the EUT in the near field without using a large anechoic chamber.

The antenna device according to another aspect of the present invention further includes: a movement device for moving the antenna in the direction of the z-axis; and a controller for moving the antenna to the position.

The antenna device according to still another aspect of the present invention further includes a signal analyzer to measure an Error Vector Magnitude (EVM) of the modulated signal which was transmitted from the EUT and received by the antenna at the position where the group delay distortion was reduced.

With this configuration, it is possible to measure the EVM as a transmission characteristic of the EUT in the near field without using a large anechoic chamber.

In the antenna device according to yet another aspect of the present invention, the signal analyzer includes: a frequency converter for converting the modulated signal (radio frequency signal) received by the antenna into a low frequency signal; an analog-to-digital (AD) converter for digitizing the low frequency signal frequency-converted by the frequency converter; and a calculation processing unit which includes an EVM calculation unit for calculating the EVM of the signal digitized by the AD converter.

With this configuration, it is possible to measure the EVM as a transmission characteristic of the EUT in the near field without using a large anechoic chamber.

The antenna device according to further aspect of the present invention, further includes a signal generator for generating the modulated signal for evaluating the reception characteristic of the EUT, wherein the modulated signal generated by the signal generator is radiated to the EUT via the antenna disposed at the position where the group delay distortion is reduced, and the EUT receives the modulated signal radiated via the antenna and calculates a reception sensitivity of the modulated signal received by the EUT.

With this configuration, it is possible to measure the reception sensitivity as a reception characteristic of the EUT in the near field without using a large anechoic chamber.

The antenna device according to one aspect of the present invention further includes a switch for switching between the signal generator and the signal analyzer.

With this configuration, it is possible to measure a transmission characteristic (EVM) and a reception characteristic (reception sensitivity) of the EUT in the near field by the same device configuration without using a large anechoic chamber.

In the antenna device according to another aspect of the present invention, the signal generator includes: a digital signal generation unit for performing calculation of digital data of the modulated signal radiated to the EUT and generating a digital signal; a digital-to-analog (DA) converter for converting the digital signal generated by the digital signal generation unit into an analog signal; and a frequency converter for converting the analog signal into the radio frequency signal with a desired frequency.

With this configuration, it is possible to measure the reception sensitivity as a reception characteristic of the EUT in the near field without using a large anechoic chamber.

The antenna device according to yet another aspect of the present invention, further includes: a data storage unit for storing information regarding the antenna to be measured and the modulated signal; and a distance calculation unit for calculating, based on the information stored in the data storage unit, a distance in a z-axis direction where the influence of the group delay distortion is reduced, wherein the distance calculated by the distance calculation unit is output to the controller.

With this configuration, it is possible to measure a transmission characteristic (such as EVM) and a reception characteristic (such as reception sensitivity) of the EUT in the near field while suppressing the influence of the group delay distortion without using a large anechoic chamber.

In the antenna device according to one aspect of the present invention, the movement device is also movable in mutually perpendicular x- and y-axis directions forming an x-y plane parallel to the plane defined by the plurality of antenna elements, wherein the antenna device further includes a data storage unit for storing information regarding the antenna to be measured and the modulated signal, a distance calculation unit for calculating, based on the information stored in the data storage unit, a distance in a z-axis direction where the influence of the group delay distortion is reduced, an amplitude phase calculation unit for calculating amplitude and phase distributions of the modulated signal radiated from the array antenna by scanning the near-field region with the antenna in an x-axis direction and a y-axis direction, a directivity calculation unit for calculating a directivity of the array antenna based on the amplitude and phase distributions, and a position calculation unit for calculating, based on the directivity and the distance in the z-axis direction, the position where the influence of the group delay distortion is reduced also in view of the directivity, and wherein the antenna is moved to the position calculated by the position calculation unit, and the antenna receives the modulated signal to determine the EVM.

With this configuration, it is possible to precisely measure the directivity and the EVM as the transmission characteristics of the EUT in the near field by suppressing the influence of the group delay distortion while taking the directivity into account without using a large anechoic chamber.

In the antenna device according to another aspect of the present invention, the antenna is disposed at the position where the antenna receives the signals radiated from each antenna element included in the array antenna in nearly equivalent levels.

With this configuration, it is possible to measure the EVM with almost the same contribution rate from all the antenna elements.

The antenna device according to another aspect of the present invention includes a rotation mechanism for tilting or rotating the antenna to the directivity center of the array antenna in accordance with the directivity of the signal radiated from the array antenna.

With this configuration, the EVM can be measured while the propagation loss is reduced even when the antenna has the directivity and the directivity center of the array antenna deviates from the z-axis.

According to one aspect of the present invention, there is provided a measurement method used for evaluating a transmission characteristic or a reception characteristic of equipment under test (EUT) having an array antenna that includes a plurality of antenna elements all anged in a plane at predetermined intervals, the measurement method including: a step in which an antenna receives a modulated signal radiated by the EUT via the array antenna or radiates the modulated signal from the antenna to the array antenna, a movement step of moving the antenna in a z-axis direction perpendicular to the plane defined by the plurality of antenna elements, and a control step of, during the movement step, performing control such that the antenna is moved to a position where a group delay distortion of the modulated signal is reduced in a near-field region.

With this configuration, it is possible to measure a transmission characteristic and a reception characteristic of the EUT in the near field without using a large anechoic chamber.

The measurement method according to another aspect of the present invention further includes a signal analysis step of measuring an Error Vector Magnitude (EVM) of the modulated signal which was transmitted from the EUT and received by the antenna at the position where the group delay distortion was reduced.

With this configuration, it is possible to measure the EVM as a transmission characteristic of the EUT in the near field without using a large anechoic chamber.

The measurement method according to a still another aspect of the present invention further includes a signal generation step of generating the modulated signal for evaluating the reception characteristic of the EUT, wherein the modulated signal generated in the signal generation step is radiated to the EUT via the antenna disposed at the position where the group delay distortion is reduced, and the EUT receives the modulated signal radiated via the antenna and determines a reception sensitivity of the modulated signal received by the EUT.

With this configuration, it is possible to measure the reception sensitivity as the reception characteristic of the EUT in the near field without using a large anechoic chamber.

Advantageous Effects of Invention

According to the present invention, it is possible to perform measurement of an EVM in the region of near-field measurement and to determine a reception sensitivity of the antenna of the EUT, thereby providing an antenna device and a measurement method which can reduce the size of measurement environment.

BRIEF DESCRIPTION OF THE DRAWINGS

FIG. 15 is a graph showing the relationship between an angular deviation from a directivity direction and a value of an EVM when the array of the antenna elements is 16 rows×1 column and the modulation bandwidth is 10 MHz.

In FIG. 22, measured values and calculated values of the reception level are plotted.

ESCRIPTION OF THE EMBODIMENTS

First Embodiment

Figure 1:
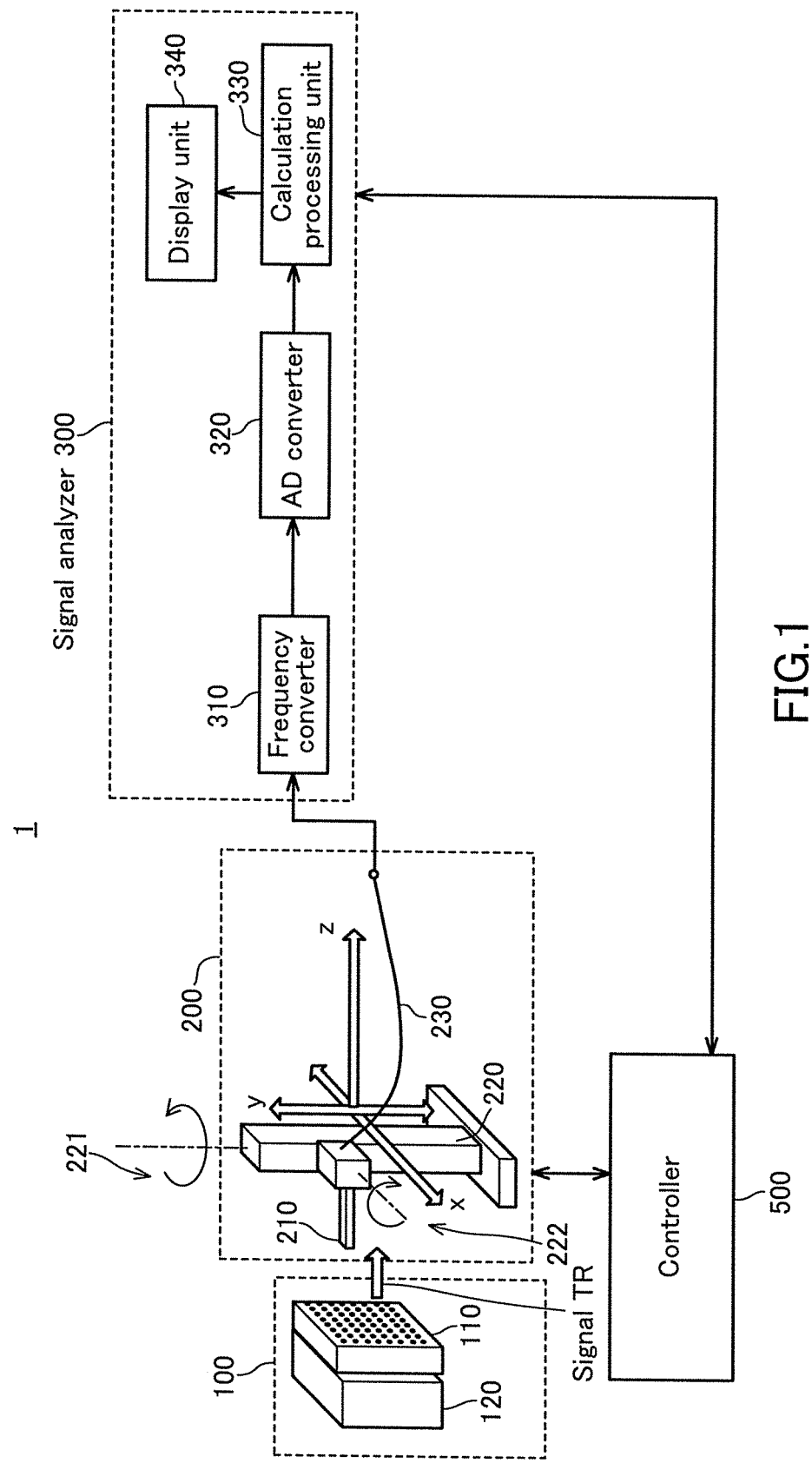
FIG. 1 is a block diagram illustrating an antenna device according to a first embodiment.

The first embodiment of the present invention will be described with reference to the drawings. FIG. 1 shows the configuration of an antenna device 1 to which the present invention is applied.

This antenna device 1 is configured to receive by a probe 210 a millimeter-wave-band modulated radio signal IR (first modulated signal) transmitted from antenna elements of an array antenna 110 of equipment under test (EUT) 100 and to analyze the received signal by a signal analyzer 300. The probe 210 is provided in a movement device 200 and has a function of a reception antenna. The radio signal TR is a modulated signal, and is an OFDM signal with a center frequency of 28 GHz and a bandwidth of 100 MHz. The array antenna 110 and the probe 210 of the present embodiment respectively correspond to an antenna to be measured and an antenna of the present invention.

Figure 2:
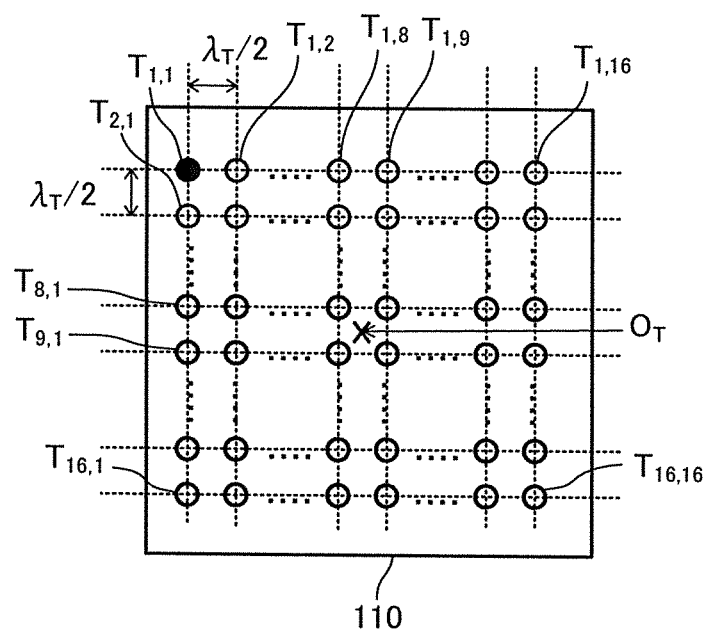
FIG. 2 is a diagram illustrating the configuration of an array antenna to be measured by the antenna device according to the first embodiment.

The EUT 100 has the array antenna 110 as the antenna to be measured, and a transmitter 120 connected to the array antenna 110. The array antenna 110 is a planar array antenna in which a plurality of antenna elements $T_{ij}$ are arranged vertically and horizontally at equal intervals. Here, i=1, 2, ..., N, and j=1, 2, ..., M. As an example, FIG. 2 shows the array antenna 110 in which the plurality of antenna elements are arranged in a square lattice pattern with N=M=16 with the same number of antenna elements in the vertical and horizontal directions at the same intervals of a wavelength $\lambda_{fT}/2$ corresponding to a center frequency of the modulated signal. $O_T$ is an origin of the coordinate system, is also a center of the array of the antenna elements, and corresponds to an aperture center of the array antenna 110.

Figure 3:
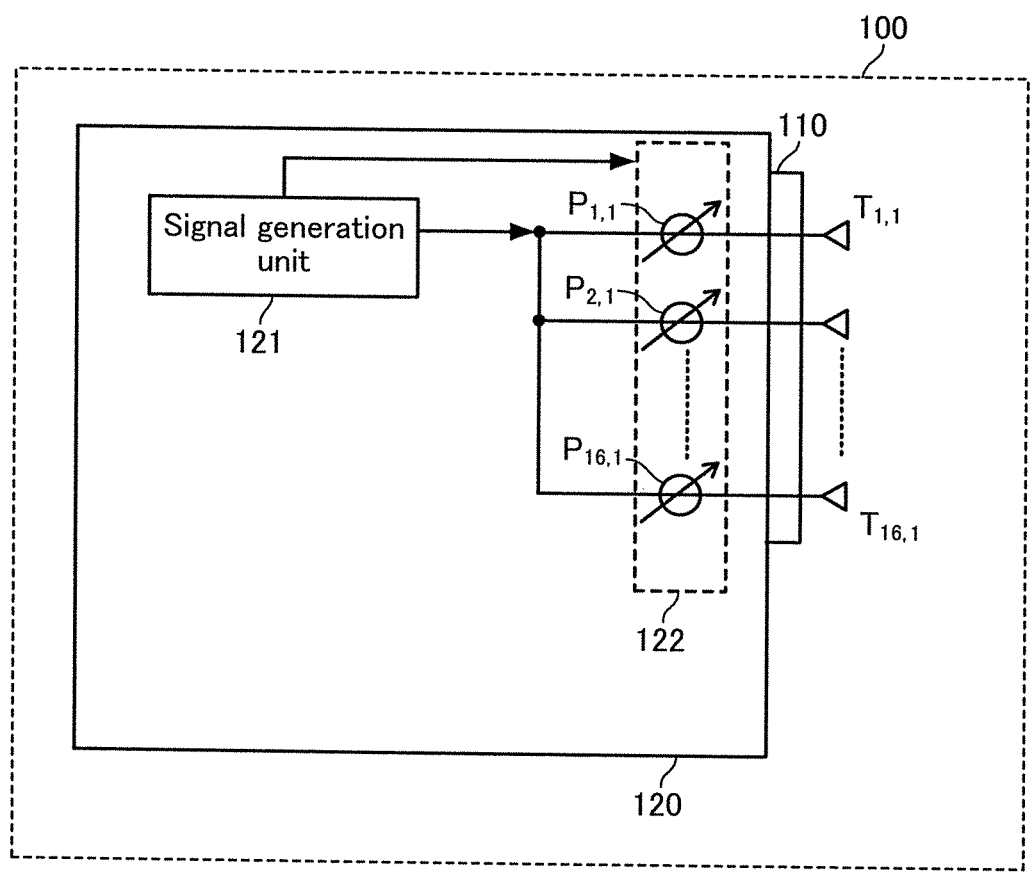
FIG. 3 is a diagram illustrating the detailed configuration of a transmitter according to the first embodiment.

FIG. 3 illustrates the detailed configuration of the array antenna 110 and the transmitter 120 of the EUT 100. The array antenna 110 has the antenna elements $T_{1,1}, T_{2,1}, \ldots, T_{16,1}, \ldots, T_{16,16}$. The transmitter 120 has a signal generation unit 121, a phase shifting unit 122 including phase shifters $P_{1,1}, P_{2,1}, \ldots, P_{16,1}, \ldots P_{16,16}$, and a reference signal source (not shown). In FIG. 3, since the arrays of the antenna elements and the phase shifters are shown in one dimension, $T_{1,2}, \ldots, T_{16,16}$ and $P_{16,2}, \ldots, P_{16,16}$ are not shown.

The phase shifters $P_{1,1}, P_{2,1}, \ldots, P_{16,16}$ of the phase shifting unit 122 are respectively connected to the antenna elements $T_{1,1}, T_{2,1}, \ldots, T_{16,16}$ of the array antenna 110. The signal generation unit 121 generates a transmission signal based on a signal output from the reference signal source and outputs the transmission signal to the phase shifting unit 122. The signal generation unit 121 also outputs phase shift information to the phase shifting unit 122 so as to set a desired phase shift amount of each phase shifter of the phase shifting unit 122. A signal whose phase value has been shifted according to the phase shift amount set by the phase shifting unit 122 is transmitted as a signal TR from the array antenna 110 via each of the antenna elements $T_{1,1}, T_{2,1}, \ldots, T_{16,16}$.

It is noted that the phase shifters $P_{1,1}, P_{2,1}, \ldots, P_{16,16}$ may be provided in the array antenna 110 and integrated with the array antenna 110, or may be a processing system at an intermediate frequency or a baseband in the signal generation unit 121. Further, the signal generation unit 121 may be provided inside the array antenna 110.

The movement device 200 shown in FIG. 1 includes a probe 210, a drive mechanism 220 connected to the probe 210, a cable 230 through which the signal received by the probe 210 is transmitted, and a signal analyzer 300 to which the cable 230 is connected.

The probe 210 is provided with a waveguide whose tip is open. An aperture plane of the waveguide of the probe 210 and a plane in which the antenna elements of the array antenna 110 are arranged are parallel to each other, and are parallel to a plane formed by an x-axis and a y-axis. A z-axis is a longitudinal direction of the waveguide of the probe 210.

The drive mechanism 220 has a three-dimensional drive mechanism for the x-axis, y-axis, and z-axis directions. Here, the x-axis and the y-axis are parallel to the plane of the array antenna 110, and are arranged to face the array antenna 110. The direction perpendicular to the plane of the array antenna 110 is defined as the z-axis. The drive mechanism 220 may have two rotation mechanisms 221 and 222 for correcting the angular deviation caused at the time of installation and for directing the directivity of the probe 210 to the EUT 100.

Through the cable 230, the high frequency signal received by the probe 210 is transmitted.

The signal analyzer 300 includes a frequency converter 310, an analog-to-digital (AD) converter 320, a calculation processing unit 330, and a display unit 340.

The frequency converter 310 is a down converter that lowers a frequency of the high frequency signal received by the probe 210 to a desired frequency. The AD converter 320 converts the signal whose frequency has been lowered into a digital signal. The signal whose frequency has been lowered by the frequency converter 310 is input to the AD converter 320 and converted into the digital signal. The digital signal is input to the calculation processing unit 330, which performs calculation processing of the directivity and EVM (Error Vector Magnitude) that indicates a modulation accuracy. In the display unit 340, the calculation results obtained by the calculation processing unit 330 are displayed.

A controller 500 controls operations of the movement device 200 and the signal analyzer 300.

Figure 4:
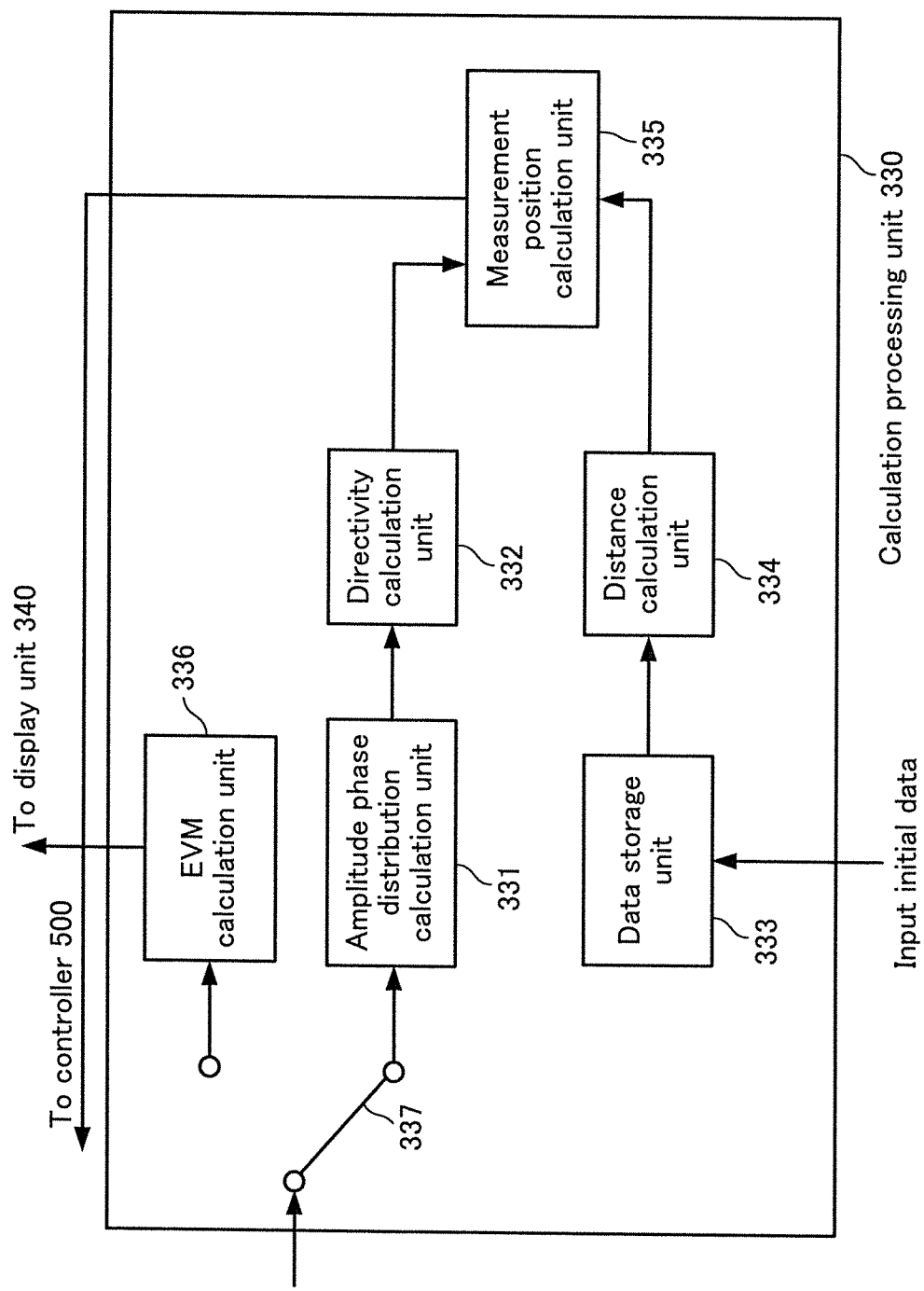
FIG. 4 is a diagram illustrating the detailed configuration of a calculation processing unit according to the first embodiment.

The detailed configuration of the calculation processing unit 330 used for signal analysis processing of the antenna device 1 will be described. As shown in FIG. 4, the calculation processing unit 330 includes an amplitude phase distribution calculation unit 331, a directivity calculation unit 332, a data storage unit 333, a distance calculation unit 334, a measurement position calculation unit 335, an EVM calculation unit 336, and a switch 337.

The amplitude phase distribution calculation unit 331 calculates an amplitude and a phase, in a near-field region, of the radio signal IR transmitted from the array antenna 110. The amplitude and the phase in the near field are obtained for a plurality of points in an x-y plane at a position zo on the z-axis within the near-field region.

In order to obtain reference phase, the reference signal source provided in the EUT 100 may be connected to the calculation processing unit 330, or in addition to the probe 210 of the movement device 200, a reference signal probe may be provided to determine a phase by the calculation processing unit 330 based on a phase difference between a signal received by the probe 210 and a signal received by the reference signal probe.

Figure 5:
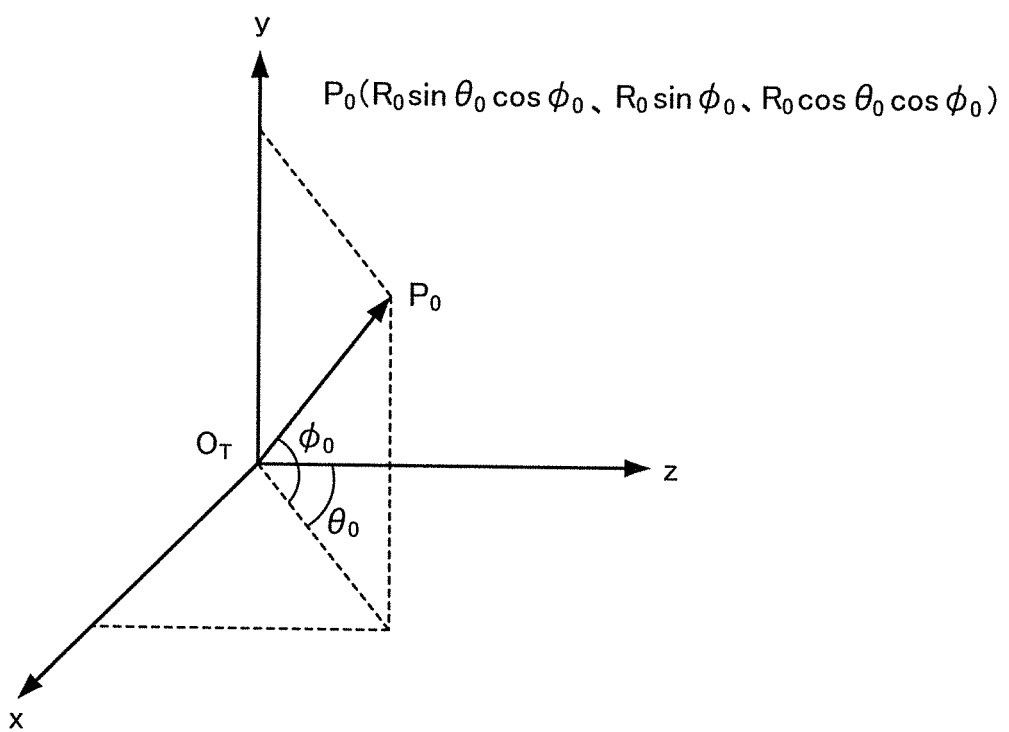
FIG. 5 illustrates a coordinate system of the movement device according to the first embodiment.

The directivity calculation unit 332 determines a direction ($\theta_0$, $\varphi_0$) of the directivity center which is a maximum radiation direction, using a known near-field to far-field transformation method such as fast Fourier transform, based on the amplitude distribution and the phase distribution in the near electromagnetic field which have been obtained by the amplitude phase distribution calculation unit 331. FIG. 5 shows a coordinate system. A direction specified by $\theta$=0 degree, and $\varphi$=0 degree is a direction along the z-axis.

In the data storage unit 333 of the calculation processing unit 330, information regarding the number of the antenna elements of the array antenna 110 and the antenna element intervals, and information regarding the center frequency and bandwidth of the modulated radio signal TR are stored in advance.

The distance calculation unit 334 calculates a distance $R_0$, in the z-axis direction, between the array antenna 110 and the probe 210 where the influence of a group delay distortion is allowable, when $\theta$=0 degree and $\varphi$=0 degree, which corresponds to a radiation direction perpendicular to the array antenna 110. The group delay distortion can be obtained by differentiating the phase difference as a function of the frequency. Further, as will be described later, the distance calculation unit can also calculate a distance necessary for making the contribution ratios of the array antenna elements equal, or a distance necessary for avoiding the increase of the residual EVM due to the increase of the distance between the array antenna 110 and the probe 210. The distance calculation unit can also obtain $R_0$ of an optimum value taking these conditions into consideration.

The measurement position calculation unit 335 calculates a measurement position $P_0$ ($R_0 \sin \theta_0 \cos \varphi_0$, $R_0 \sin \varphi_0$, $R_0 \cos \theta_0 \cos \varphi_0$) from $\theta_0$ and $\varphi_0$ obtained by the directivity calculation unit 332 and the distance $R_0$ obtained by the distance calculation unit 334. The measurement position $P_0$ is a measurement position that is determined taking the directivity into account where the influence of the group delay distortion is allowable. The measurement position calculation unit 335 outputs information regarding the measurement position $P_0$ to the controller 500, and the controller 500 performs control such that the movement device 200 moves the probe 210 to the measurement position $P_0$. As will be described later, the measurement position may be a position which satisfies the condition that the contribution ratios of the array antenna elements are equalized with one another, or the condition that the increase of the residual EVM due to the increase of the distance between the array antenna 110 and the probe 210 can be avoided, in addition to the condition that the influence of the group delay distortion is allowable.

The EVM calculation unit 336 calculates the EVM. The switch 337 switches from the amplitude phase distribution calculation unit 331 side to the EVM calculation unit 336 side to calculate the EVM based on the digital signal input to the EVM calculation unit 336.

Figure 6:
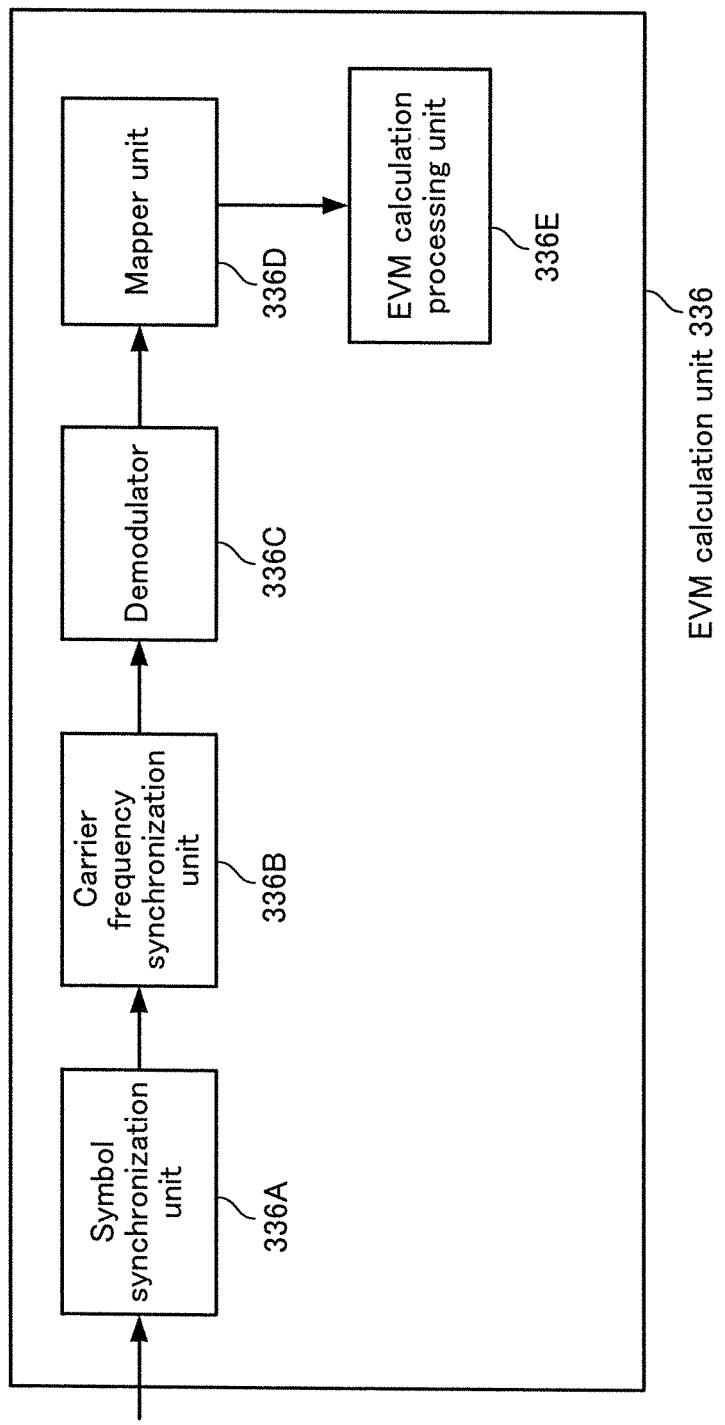
FIG. 6 illustrates the detailed configuration of an EVM calculation unit in the calculation processing unit according to the first embodiment.

FIG. 6 illustrates the configuration of the EVM calculation unit 336. The EVM calculation unit 336 includes a symbol synchronization unit 336A, a carrier frequency synchronization unit 336B, a demodulator 336C that performs processing such as fast Fourier transform, a mapper unit 336D, and an EVM calculation processing unit 336E.

The symbol synchronization unit 336A roughly estimates the timing of OFDM symbols by using the correlation of guard intervals. By using, at this estimated timing, a signal demodulated by the demodulator 336C, the timing at which the correlation becomes a maximum can be obtained as a precise symbol synchronization timing.

The carrier frequency synchronization unit 336B calculates the difference between a set value and an actually measured value of the center frequency $f_c$, adjusts a frequency of a local signal input to the frequency converter 310, and correct the group delay distortion using pilot subcarriers. However, since nonlinearity within a pilot subcarrier interval cannot be eliminated, when the group delay distortion caused by the distance between the array antenna 110 and the probe 210, multiple reflections, and the like have nonlinearity within the pilot subcarrier interval, this nonlinearity causes the residual EVM.

The demodulator 336C demodulates a digital signal synchronized by the symbol synchronization unit 336A and the carrier frequency synchronization unit 336B by performing processing such as fast Fourier transform. The mapper unit 336D creates a constellation map based on the demodulated digital signal.

The EVM calculation processing unit 336E calculates an $EVM_{rms}$ according to the following equation 1 or equation 2 as an error ratio from an ideal value of a symbol, based on the constellation map created by the mapper unit 336D.

$$EVM_{rms} = \frac{1}{N}\sum_{j=1}^{N} \frac{\left(\sqrt{(I_j - I_{0j})^2 + (Q_j - Q_{0j})^2}\right)}{|V_{MAX}|} \quad \text{Equation 1}$$

where $I_j$ and $Q_j$ are respectively the values on an I-axis and a Q-axis of the j-th symbol, $I_{0j}$ and $Q_{0j}$ are respectively the ideal values on the I-axis and the Q-axis of the j-th symbol, and $V_{MAX}$ is a maximum distance of an ideal symbol point from the origin.

$$EVM_{rms} = \frac{1}{N}\sum_{j=1}^{N} \frac{\left(\sqrt{(I_j - I_{0j})^2 + (Q_j - Q_{0j})^2}\right)}{|V_{AVE}|} \quad \text{Equation 2}$$

where $I_j$ and $Q_j$ are respectively the values on an I-axis and a Q-axis of the j-th symbol, $I_{0j}$ and $Q_{0j}$ are respectively the ideal values on the I-axis and the Q-axis of the j-th symbol, and $V_{AVE}$ is an average distance of an ideal symbol point from the origin. Since $V_{MAX}=V_{AVE}$ in QPSK, the same calculation results are obtained by Equation 1 and Equation 2. However, in the case of the QAM type modulation system, since $V_{max} \neq V_{AVE}$, the calculation results obtained by Equation 1 and Equation 2 are different to each other. Therefore, in order to evaluate the influence of the group delay distortion regardless of the modulation system, Equation 2 is used in the following calculations.

Further, a phase shift setting unit (not shown) provided in the EUT 100 may also control the phase shifters $P_{1,1}$, $P_{2,1}, \ldots, P_{16,16}$ to change a phase amount of the transmission signal input to each antenna element $T_{ij}$ so as to evaluate the EVM for any directivity $(\theta, \varphi)$.

It is also possible to directly connect the AD converter 320 to the EVM calculation unit 336 without providing the switch 337 of the calculation processing unit 330 so as to directly calculate the EVM without calculating the directivity. In this case, an optimum position of the probe 210 is obtained from information acquired in advance regarding the array antenna 110 and the modulated signal, and the probe 210 is moved to the optimum position, thereby omitting to obtain the actually measured value of the directivity.

Simulation

Simulation results of the calculation of the EVM will be described in order.

Figure 7:
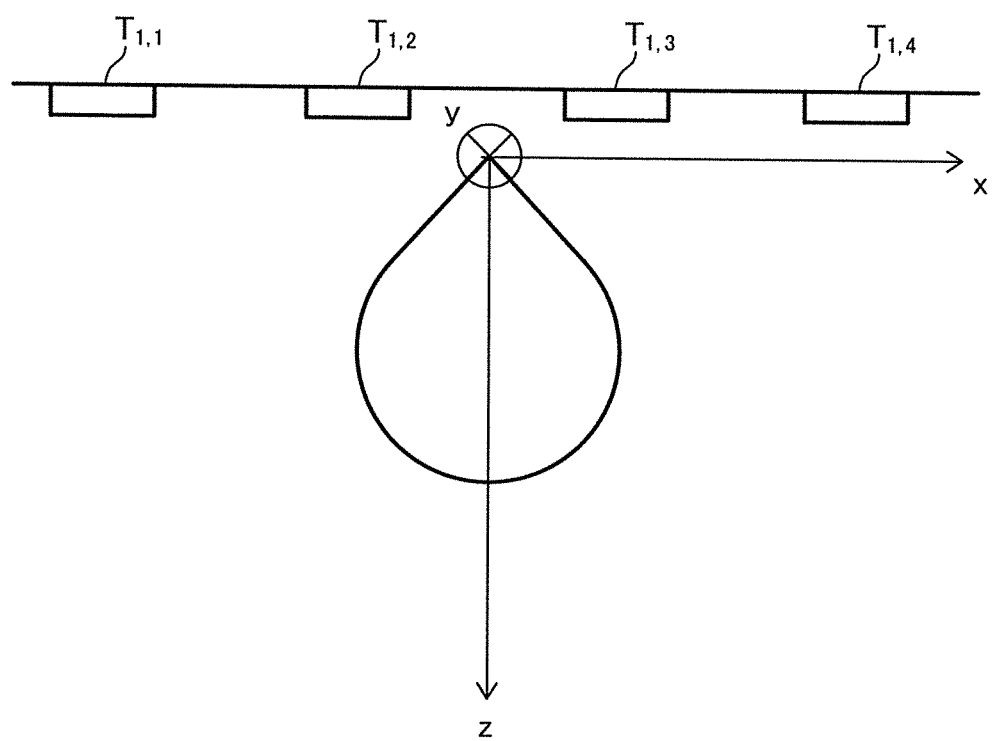
FIG. 7 is a diagram illustrating the configuration in which the array of the antenna elements is 4 rows×1 column.

First, simulation results in the case where the array of the antenna elements is 4 rows×1 column shown in FIG. 7 will be described. The origin of the coordinate system is a midpoint between the antenna elements $T_{1,2}$ and $T_{1,3}$. It is assumed that the radiation direction of the array antenna 110 coincides with the z-axis.

When EVM measurement is performed by the antenna device 1, consideration has to be given also to the contribution ratios of the antenna elements of the array antenna in addition to the influence of the group delay due to the fact that the above-mentioned signal to be measured is a modulated signal. Specifically, when the array antenna 110 and the probe 210 are brought too close to each other, the quality of a signal radiated from some of the array antennas is measured, thereby leading to the result that the measured EVM is different from an EVM of a signal radiated from the entire antenna elements of the array antenna of the transmitter.

Figure 8:
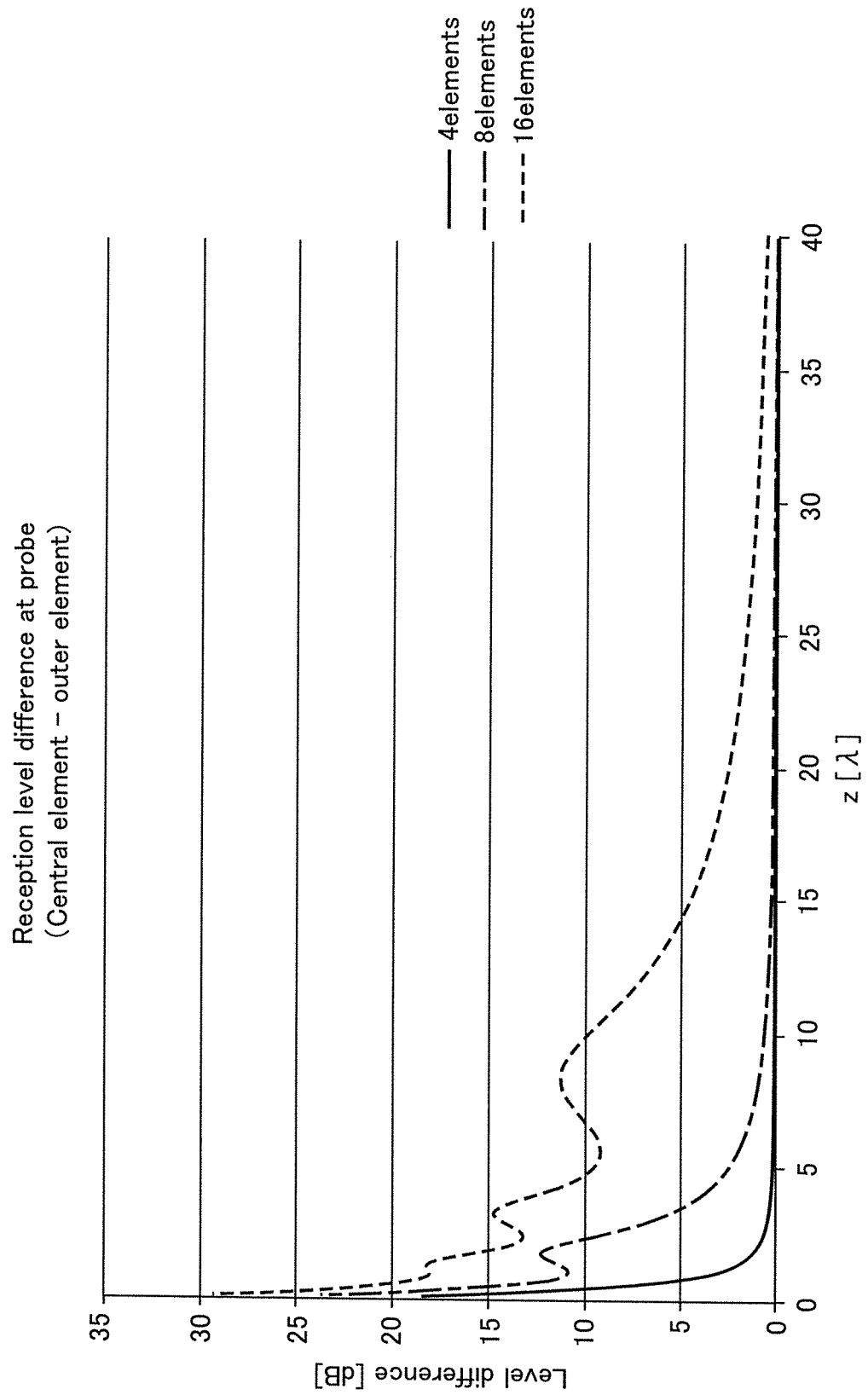
FIG. 8 shows the simulation results on the probe position dependency of a reception level difference between a central antenna element and an outer antenna element in each case where the array of the antenna elements is 4 rows×1 column, 8 rows×1 column, and 16 rows×1 column.

An example showing the contribution rate of each antenna element of the array antenna is shown in FIG. 8. FIG. 8 is a graph showing the simulation results of the probe position dependency of the reception level difference at the probe 210 in each case where the array of the antenna elements is 4 rows×1 column, 8 rows×1 column, and 16 rows×1 column described later in FIG. 11. Specifically, FIG. 8 shows the relationship of the value of the reception level difference (reception power difference) between the center antenna element and the outer antenna element with respect to the position on the z-axis of the probe 210. The position on the z-axis is normalized with $\lambda_T$. The reception power difference being large Means that the contribution of the outer antenna element to the EVM is small, that is, meaning that the difference between an EVM measurement value obtained in the near field and an EVM measurement value in the far field becomes large.

In order to measure the EVM at almost the same contribution rate from all the antenna elements, the power from each antenna element must be substantially equal at the probe 210. For example, in the case of the antenna elements of 4 rows×1 column, when the position on the z-axis of the probe 210 is $2\lambda_T$, the contribution ratio difference is less than 1 dB; in the case of the antenna elements of 8 rows×1 column, when the position on the z-axis is $8\lambda_T$, the contribution ratio difference is less than 1 dB; and in the case of the antenna elements of 16 rows×1 column, when the position on the z-axis is $32\lambda_T$, the contribution ratio difference is less than 1 dB. Therefore, these z-values on the z-axis can be used as one criterion in order to measure the EVM with substantially the same contribution ratio from all the antenna elements.

Figure 9:
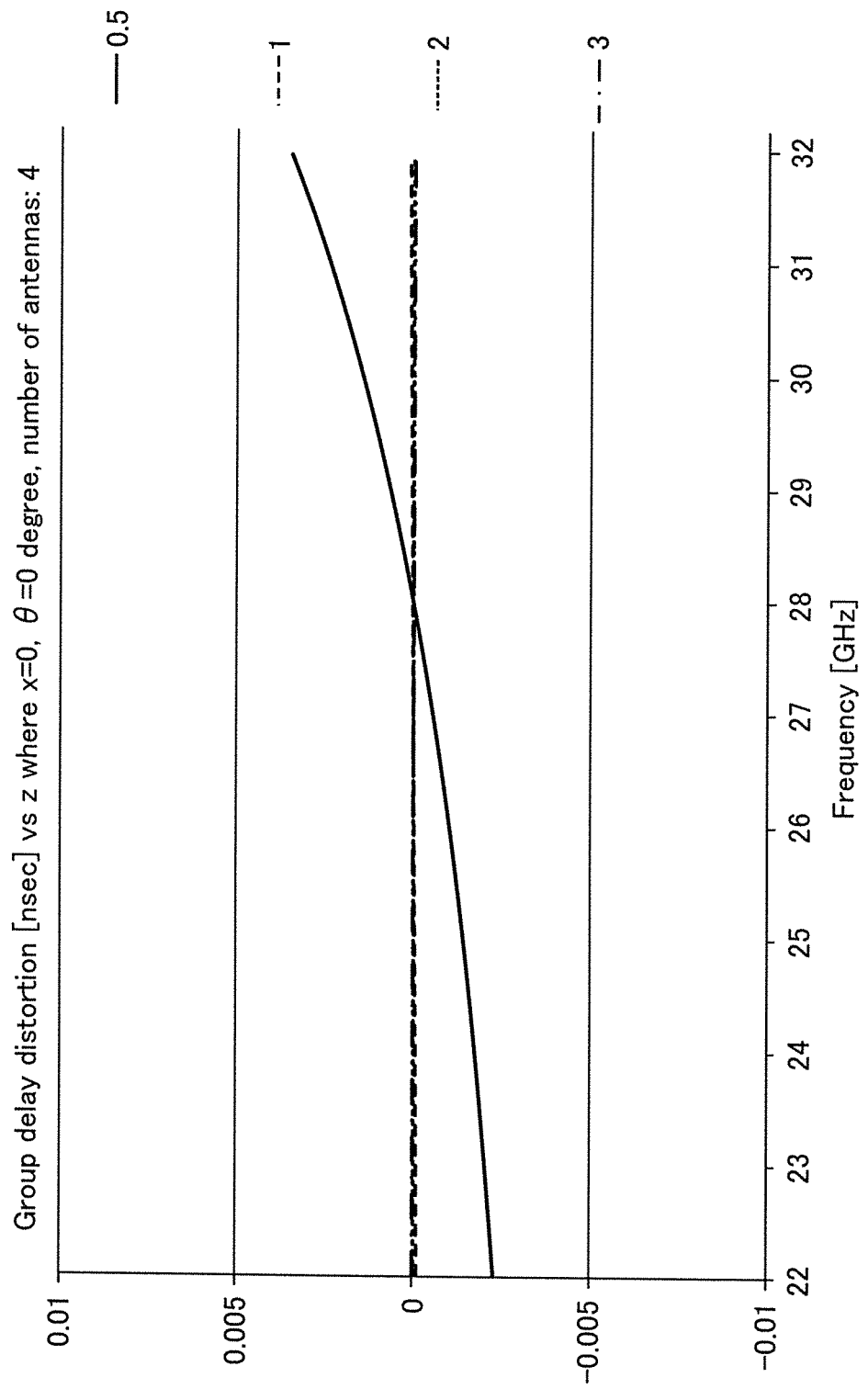
FIG. 9 is a graph showing frequency characteristics of a group delay distortion when the array of the antenna elements is 4 rows×1 column.

FIG. 9 shows simulation results of the frequency characteristic of a group delay distortion of a signal transmitted from the array antenna 110 in the case where the array of the antenna elements is 4 rows×1 column. Four kinds of simulations were performed with a z-component of a position $P_0(0, 0, z)$ of the probe 210 set to $z=0.5\lambda_T, \lambda_T, 2\lambda_T,$ and $3\lambda_T$. The legend on the graph is noted with normalization by $\lambda_T$. From FIG. 9, it can be seen that the value of the group delay distortion approaches zero when the distance on the z-axis from the origin becomes equal to or greater than $\lambda_T$. From FIG. 9, in the case where the signal radiated from the entire antenna elements of the array antenna 110 of the transmitter is received by the probe 210 within the range satisfying the distance condition of the near field, when the distance from the origin is $0.5\lambda_T$, the distance difference until arriving, at the probe antenna, of a radio wave from each antenna element of the antenna to be measured cannot be neglected. Accordingly, when vector addition of the signals coming from each antenna element to the antenna is performed to determine the phase, a phase rotation amount corresponding to the distance between the array antenna 110 and the probe 210 is generated, whereby the phase value becomes unstable. On the other hand, it can be seen that when the distance on the z-axis is equal to or greater than $\lambda_T$, the value of the phase tends to be stable, and the value of the group delay distortion approaches zero.

Figure 10:
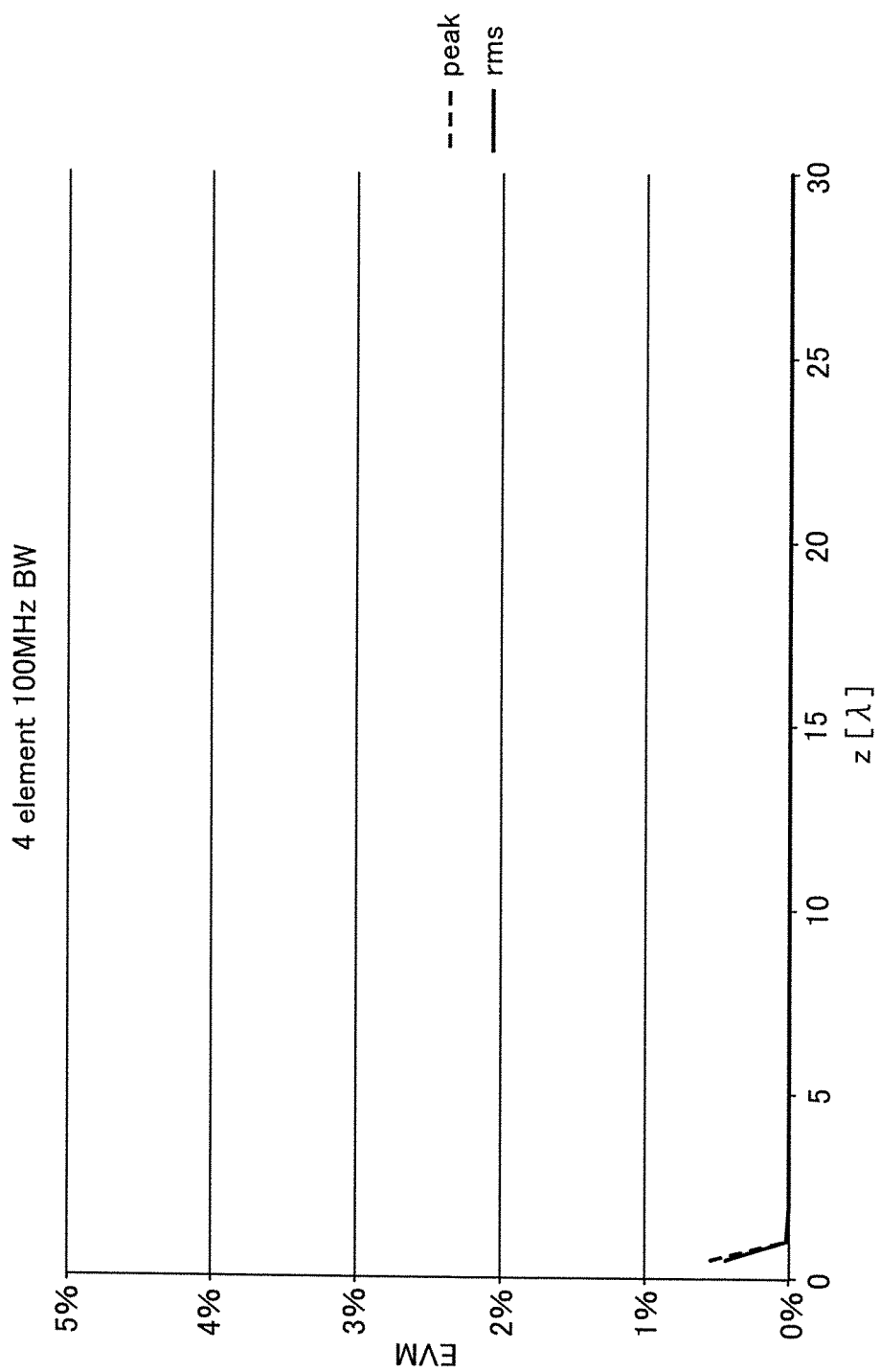
FIG. 10 is a graph showing probe position dependency of an EVM when the array of the antenna elements is 4 rows×1 column.

FIG. 10 shows simulation results of the relationship of the values of the $\text{EVM}_{peak}$ and $\text{EVM}_{rms}$ of the signal transmitted from the antenna elements of 4 rows×1 column when the probe 210 is moved on the z-axis in the case where the modulation bandwidth (pilot subcarrier interval) is 100 MHz. The z-axis is normalized with $\lambda_T$. With regard to the modulated signal, the primary modulation is QPSK, the secondary modulation is OFDM, and the bandwidth (or pilot subcarrier interval) is set to 100 MHz. In this case, the modulation bandwidth is 100 MHz. When the z-component of the position $P_0(0, 0, z)$ of the probe 210 is $\lambda_T$ or more, both the $\text{EVM}_{peak}$ and $\text{EVM}_{rms}$ decrease. That is, when the array of the antenna elements is 4 rows×1 column, the distance on the z-axis at which the group delay distortion is reduced is $\lambda_T$. Also considering the above-described contribution ratios from the antenna elements, it is possible to accurately measure the EVM in the near-field region by measuring the EVM at $z=2 \lambda_T$ without measuring the EVM in the far field.

Figure 11:
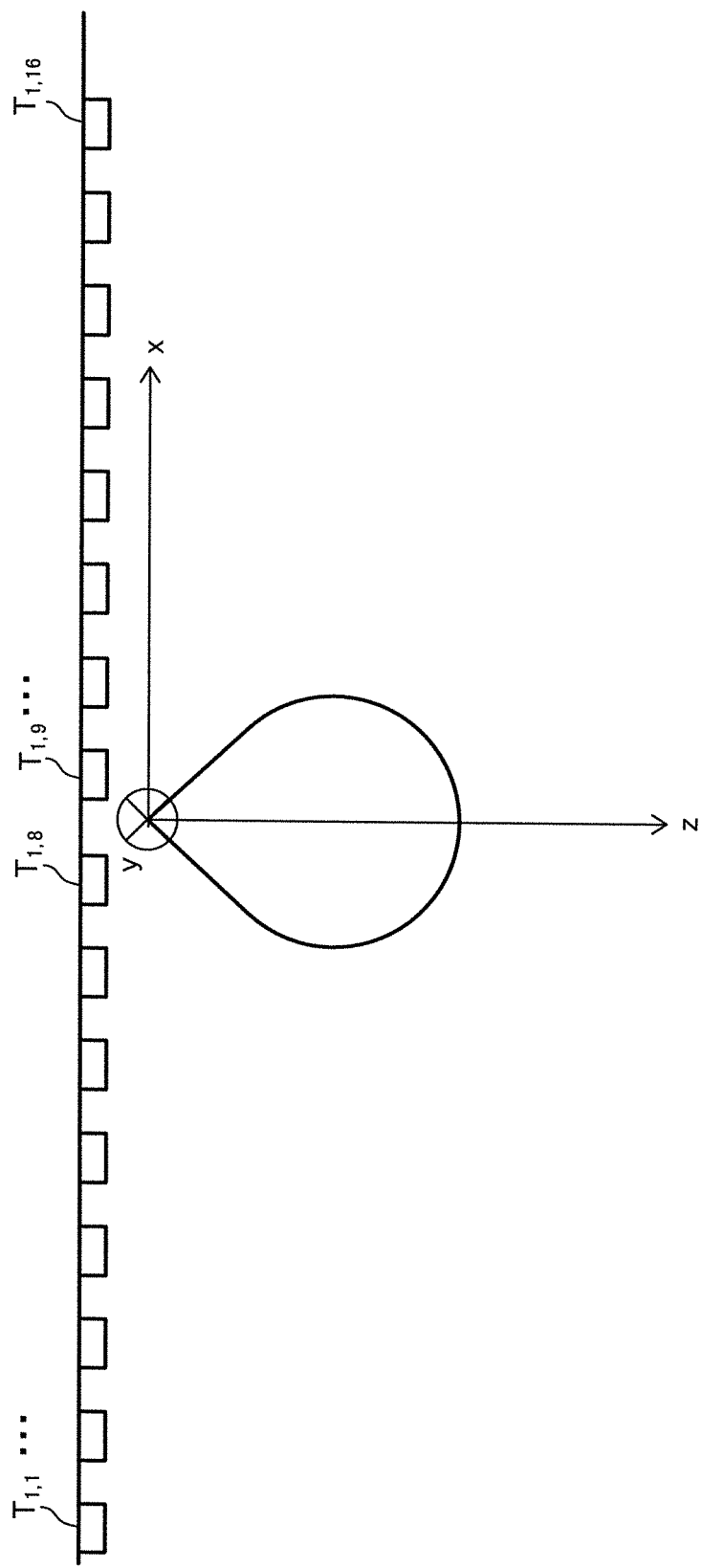
FIG. 11 is a diagram illustrating the configuration in which the array of the antenna elements is 16 rows×1 column.

Next, simulation results will be described in the case where the array of the antenna elements is 16 rows×1 column shown in FIG. 11. The antenna elements are sixteen elements $T_{1,1}, T_{1,2}, \ldots, T_{1,8}, T_{1,9}, \ldots, T_{1,16}$, the center of the coordinate system is a midpoint between $T_{1,8}$ and $T_{1,9}$, and other things are the same as those in FIG. 7.

Figure 12:
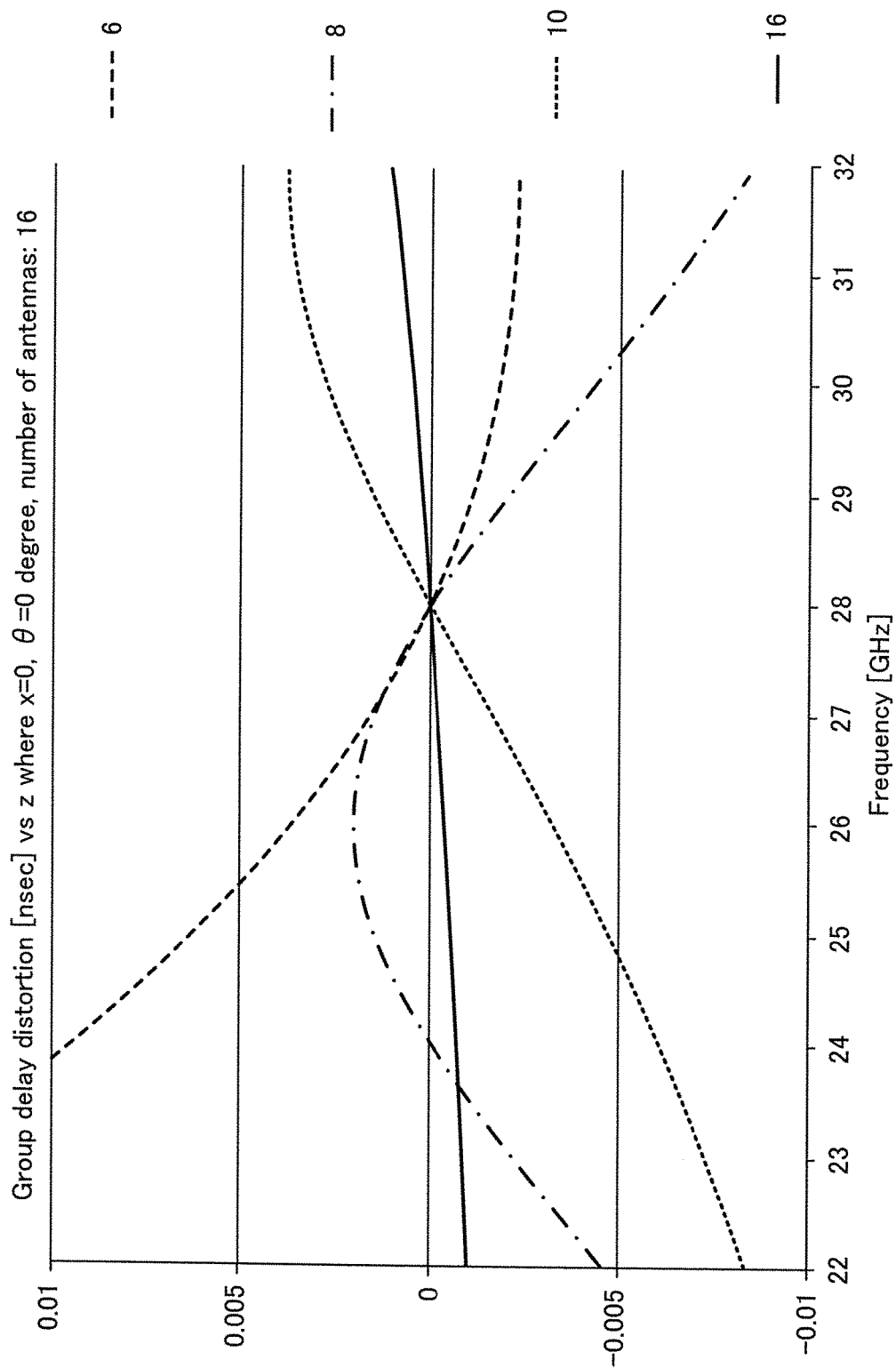
FIG. 12 is a graph showing frequency characteristics of a group delay distortion when the array of the antenna elements is 16 rows×1 column.

FIG. 12 shows simulation results of the frequency characteristic of a group delay distortion in the case where the array of the antenna elements is 16 rows×1 column. The simulation was performed on four cases where the z-component of the position $P_0(0, 0, z)$ of the probe 210 was $z=6\lambda_T$, $8\lambda_T$, $10\lambda_T$, and $16\lambda_T$.

As shown in FIG. 12, in the case of $z=6\lambda_T$ in which the position of the probe 210 is closer to the origin, there exists a frequency region in which the value of the group delay distortion diverges, because the value of the phase becomes unstable due to the occurrence of the phase rotation amount described above. In the cases of $z=10\lambda_T$ and $16\lambda_T$ distant from the origin, the value of the group delay distortion tends to asymptotically approach zero in the measurement frequency range. In practice, the distance that gives a desired group delay distortion is selected according to the pilot subcarrier interval of the OFDM.

Figure 13:
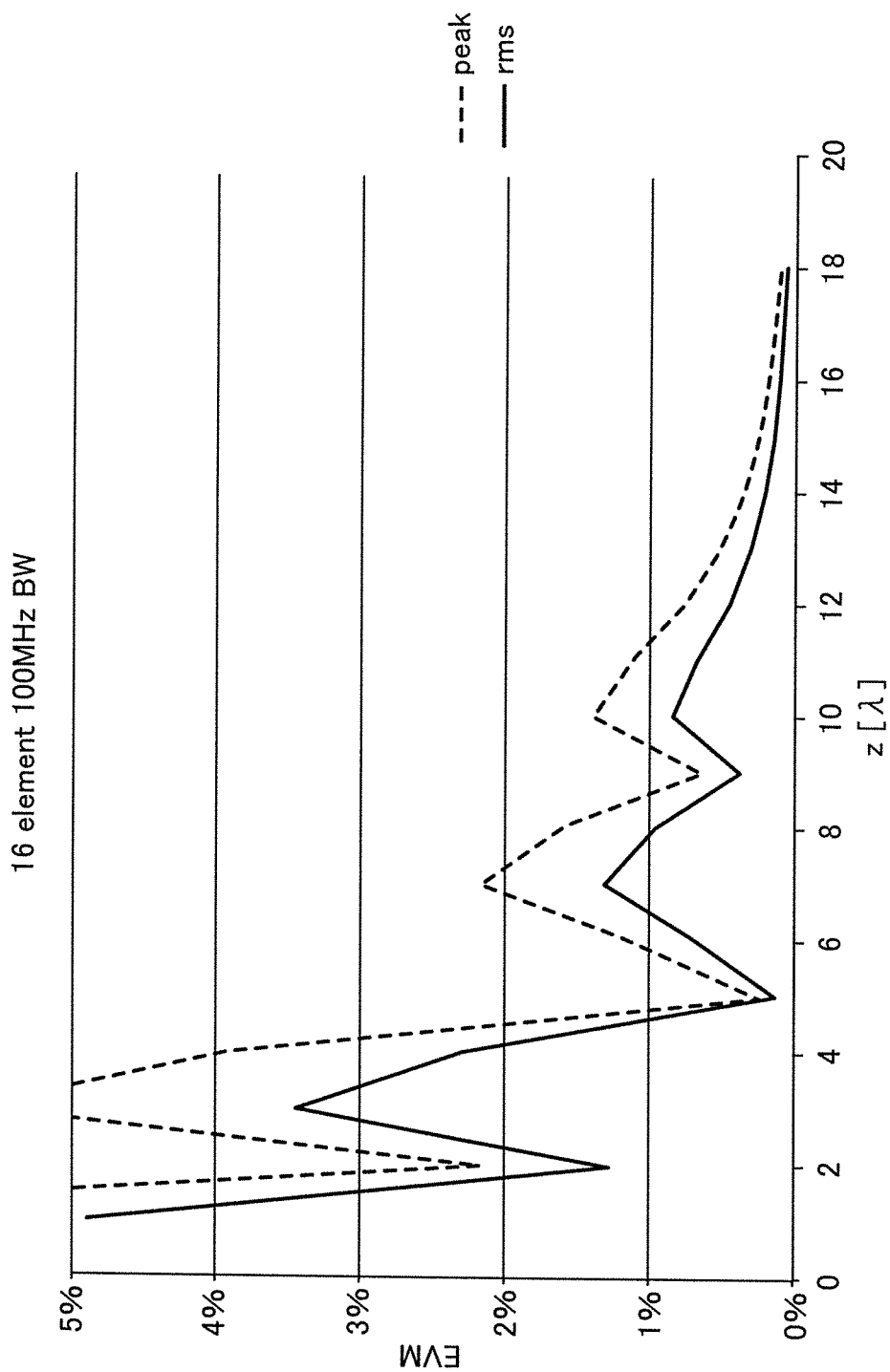
FIG. 13 is a graph showing probe position dependency of an EVM when the array of the antenna elements is 16 rows×1 column and the modulation bandwidth is 100 MHz.

FIG. 13 shows simulation results of the relationship of the values of the $EVM_{peak}$ and $EVM_{rms}$ of the signal transmitted from the antenna elements with respect to the position on the z-axis of the probe 210 in the case where the array of the antenna elements is 16 rows×1 column. The z-axis is normalized with $\lambda_T$. The modulation bandwidth (pilot subcarrier interval) in FIG. 13 is 100 MHz. When the z-component of the position $P_0(0, 0, z)$ of the probe 210 is $z \geq 12\lambda_T$, the values of the $EVM_{peak}$ and $EVM_{rms}$ are lower than 1%. However, as described above, it is necessary to secure a distance of $32\lambda_T$, in order to make the contribution ratios of components radiated from all the antenna elements substantially equal in the case of 16 rows×1 column elements. Therefore, the EVM may be measured at a position of $z=32\lambda_T$, for example.

Figure 14:
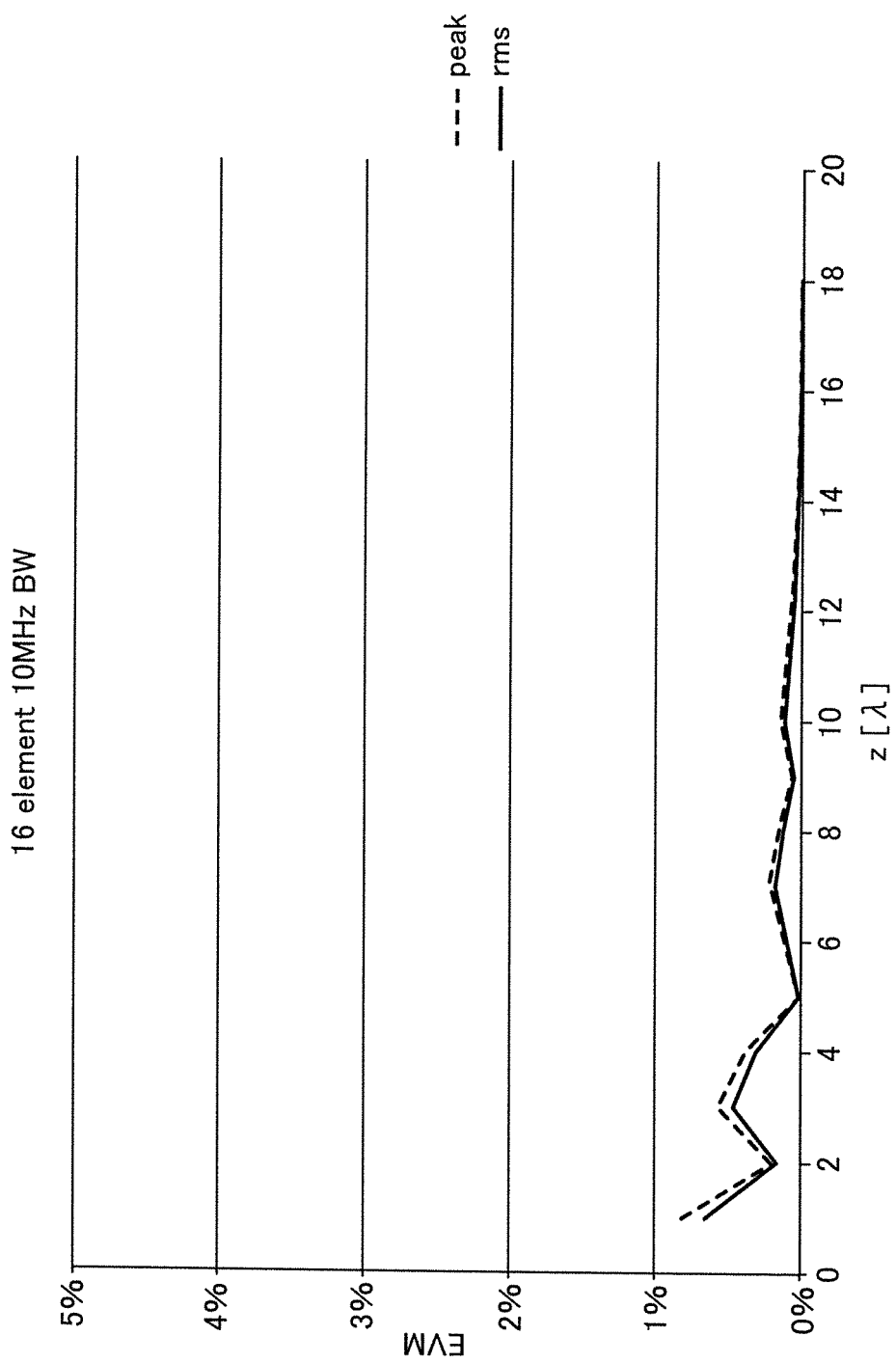
FIG. 14 is a graph showing probe position dependency of an EVM when the array of the antenna elements is 16 rows×1 column and the modulation bandwidth is 10 MHz.

FIG. 14 shows the relationship of the values of the $EVM_{peak}$ and $EVM_{rms}$ of the signals transmitted from the antenna elements of 16 rows×1 column with respect to the position on the z-axis of the probe 210 when the modulation bandwidth is 10 MHz which is a pilot subcarrier interval. The z-axis is normalized with $\lambda_T$. When the z-component of the position $P_0(0, 0, z)$ of the probe 210 is $\lambda_T$ or more, the values of the $EVM_{peak}$ and $EVM_{rms}$ are lower than 1%. However, as described above, the distance of $32\lambda_T$ must be secured in order to make the contribution ratios of components radiated from all the antenna elements substantially equal in the case of the antenna elements of 16 rows×1 column. Therefore, the EVM may be measured at a position of $z=32\lambda_T$, for example.

FIG. 15 shows simulation results of the relationship of the EVM with respect to a value of an angle $\theta_0$ in the case where the modulation bandwidth (pilot subcarrier interval) is 10 MHz and the array of the antenna elements is 16 rows×1 column. The position $P_0(12\lambda_T \tan\theta_0, 0, 12\lambda_T)$ of the probe 210 is inclined by the angle $\theta_0$ from a position on the z-axis where $z=12\lambda_T$. When $\theta_0=0$ degree which corresponds to a center of a beam, the values of the $EVM_{peak}$ and $EVM_{rms}$ are small. However, when $\theta_0$ is more than 20 degrees, the values of the $EVM_{peak}$ and $EVM_{rms}$ exceed 1%, so that the influence of the EVM value cannot be ignored. Hereinafter, "modulation bandwidth" and "pilot subcarrier interval" are regarded as being synonymous, and the term "pilot subcarrier interval" is used.

Therefore, it is desirable to measure the directivity beforehand to obtain an optimum value of z before the measurement of the EVM. However, in the case where information regarding the pilot subcarrier interval, the number of the antenna elements of the array antenna 110, and the like is known in advance, the directivity calculation processing may be omitted by determining an appropriate measurement position by calculation.

Next, simulation results performed on the array antenna in which the array of the antenna elements is 8 rows×1 column will be described.

The antenna elements include eight elements $T_{1,1}$, $T_{1,2}$, ..., $T_{1,8}$, which are arranged in the x-axis direction. The center of the coordinate system is a midpoint between $T_{1,4}$ and $T_{1,5}$, and the other coordinate axes are the same as those in FIG. 7.

Figure 16A:
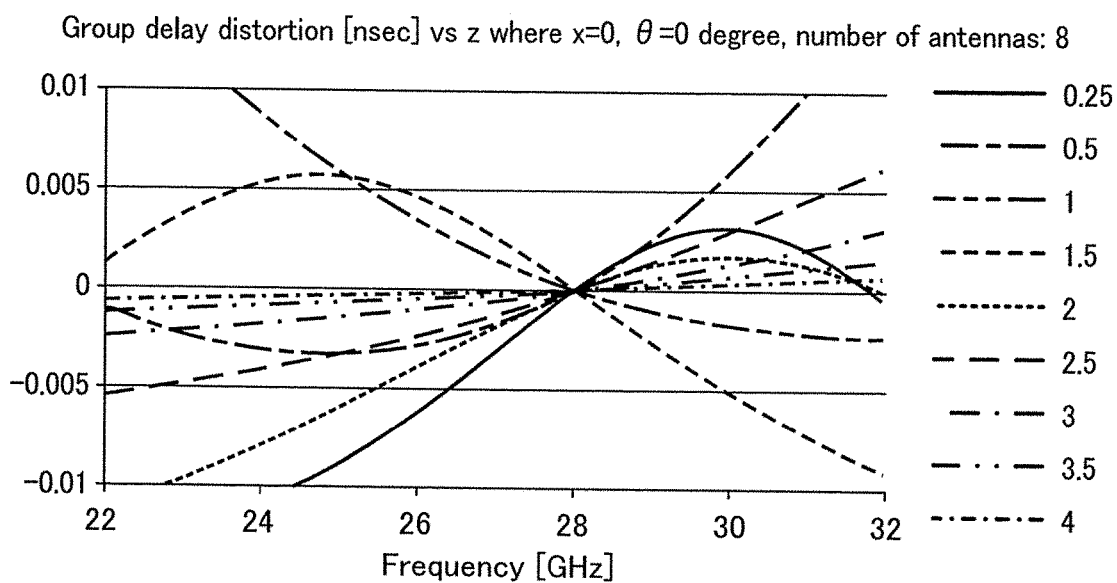
FIG. 16A is a graph showing frequency characteristics of a group delay distortion when the array of the antenna elements is 8 rows×1 column.
Figure 16B:
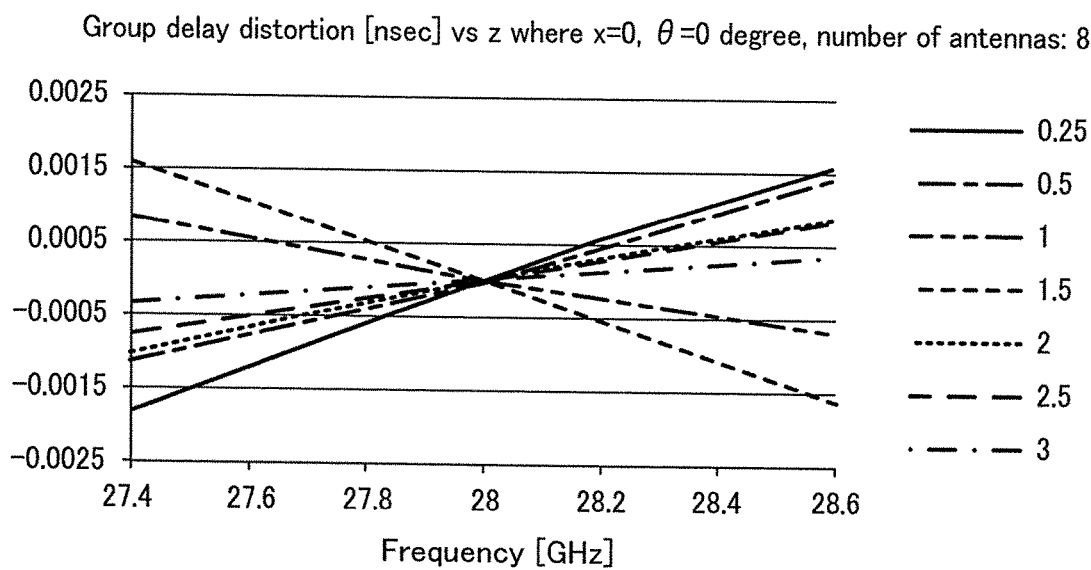
FIG. 16B is a partially enlarged graph of FIG. 16A with a frequency axis being enlarged.

FIG. 16A shows simulation results of the frequency characteristic of a group delay distortion caused by the fact that the path length from each antenna element to the antenna is different, in the case where the array of the antenna elements is 8 rows×1 column. Specifically, the simulations were conducted in nine cases where the z-component of the position $P_0(0, 0, z)$ of the probe 210 is $z=0.25\lambda_T$, $0.5\lambda_T$, $1\lambda_T$, $1.5\lambda_T$, $2\lambda_T$, $2.5\lambda_T$, $3\lambda_T$, $3.5\lambda_T$, and $4\lambda_T$. FIG. 16B is an enlarged graph of a part of FIG. 16A in the vicinity at a frequency of 28 GHz.

As shown in FIG. 16A and FIG. 16B, in the cases where $z=0.25\lambda_T$, $0.5\lambda_T$, $1\lambda_T$, $1.5\lambda_T$, $2\lambda_T$, and $2.5\lambda_T$, namely, the position of the probe 210 is closer to the origin, there exists a frequency range in which the value of the group delay distortion increases. In the cases of $z=3\lambda_T$, $3.5\lambda_T$, and $4\lambda_T$ which are distant from the origin, there is a tendency that the value of the group delay distortion gradually approaches zero in the measurement frequency range. In practice, the distance that gives a desired group delay distortion is selected according to the pilot subcarrier interval of OFDM.

Figure 17:
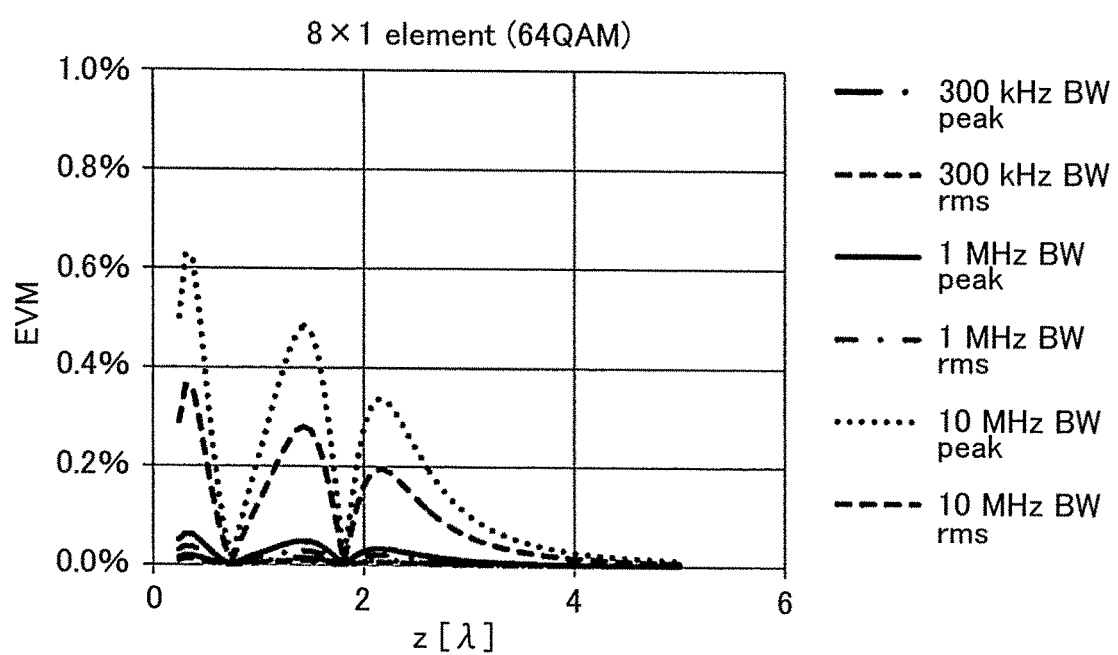
FIG. 17 is a graph showing probe position dependency of an EVM in the case where the array of the antenna elements is 8 rows×1 column.

FIG. 17 shows simulation results of the probe position dependency of the EVM in each case where the pilot subcarrier interval is 10 MHz, 1 MHz, and 300 kHz when the array of the antenna elements is 8 rows×1 column. Specifically, the simulation was conducted on the relationship of the values of the $EVM_{peak}$ and $EVM_{rms}$ of a signal transmitted from the array antenna 110 with respect to the position on the z-axis of the probe 210. The z-axis is normalized with $\lambda_T$.

As shown in FIG. 17, as the pilot subcarrier interval becomes wider, the group delay distortion caused by the fact that the path length from each antenna element to the antenna is different becomes larger, so that the residual EVM deteriorates. This tendency becomes remarkable as the z-component of the position $P_0(0, 0, z)$ of the probe 210 becomes smaller (in particular, the range of $z \leq 4\lambda_T$). Specifically, in the case where the pilot subcarrier interval is 10 MHz, when the z-component of the position $P_0(0, 0, z)$ of the probe 210 is $z \geq 3\lambda_T$, the values of the residual $EVM_{peak}$ and residual $EVM_{rms}$ are less than 0.1%. Further, in the cases where the pilot subcarrier interval is 1 MHz and 300 kHz, the value of the EVM is less than that in the case of 10 MHz, and when the z-component at the position $P_0(0, 0, z)$ of the probe 210 satisfies $z \geq 0.5\lambda_T$, the values of the $EVM_{peak}$ and $EVM_{rms}$ are much less than 0.05%. In the experiment described later, a signal with a pilot subcarrier interval of 300 kHz was used. Moreover, the simulation result of this time was not completely consistent with the experiment result described later. The cause may be the influence on the group delay distortion due to the multiple reflections due to the distance between the antennas. Therefore, it is necessary to secure a distance not affected by the multiple reflections based on the electromagnetic field simulation result of the array antenna and the probe which are actually used.

Figure 18A:
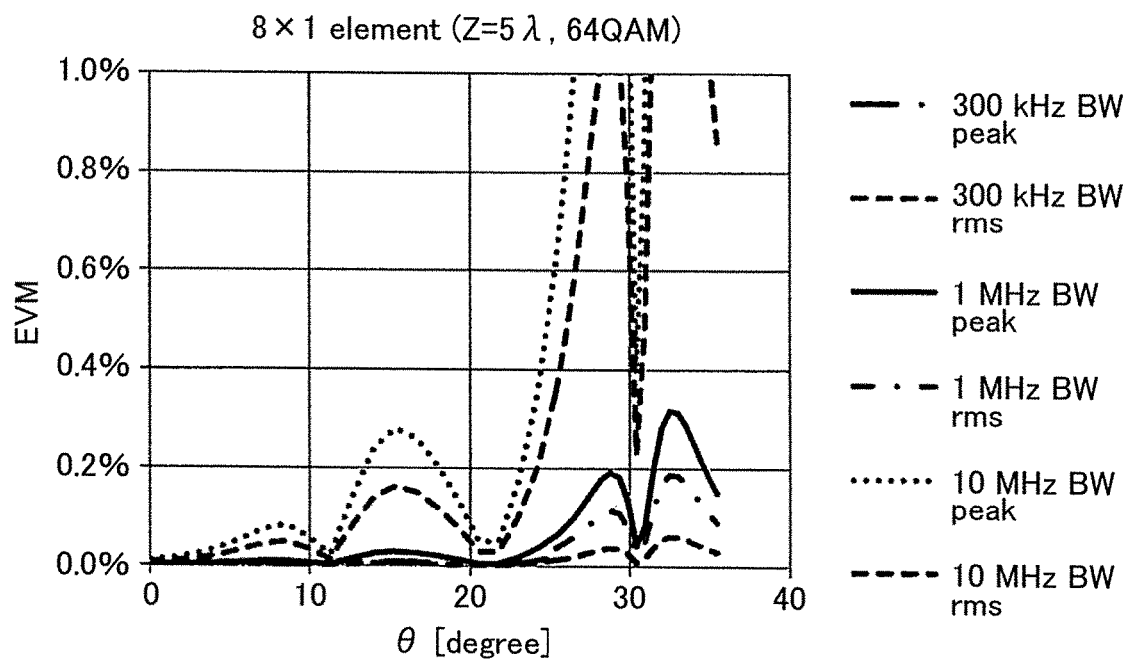
FIG. 18A and FIG. 18B are graphs showing the relationship between an angular deviation from the direction of the directivity center and the value of EVM when the array of the antenna elements is 8 rows×1 column.

FIG. 18A shows simulation results of the relationship between an angular deviation from the directivity center direction and the residual EVM value in each case where the pilot subcarrier interval is 10 MHz, 1 MHz, and 300 kHz when the array of the antenna elements is 8 rows×1 column.

Specifically, FIG. 18A shows the relationship of the residual EVM with respect to the value of an angle $\theta_0$ at the position $P_0(5\lambda_T \tan \theta_0, 0, 5\lambda_T)$, which is inclined by the angle $\theta_0$ from a position where the probe is disposed with a z-component on the z-axis being $z=5\lambda_T$. It can be seen that at $\theta_0=0$ degree corresponding to the directivity center, the values of the residual $EVM_{peak}$ and residual $EVM_{rms}$ are small, but when $\theta_0$ exceeds 25 degrees, the values of the residual $EVM_{peak}$ and residual $EVM_{rms}$ suddenly increase.

Figure 18B:
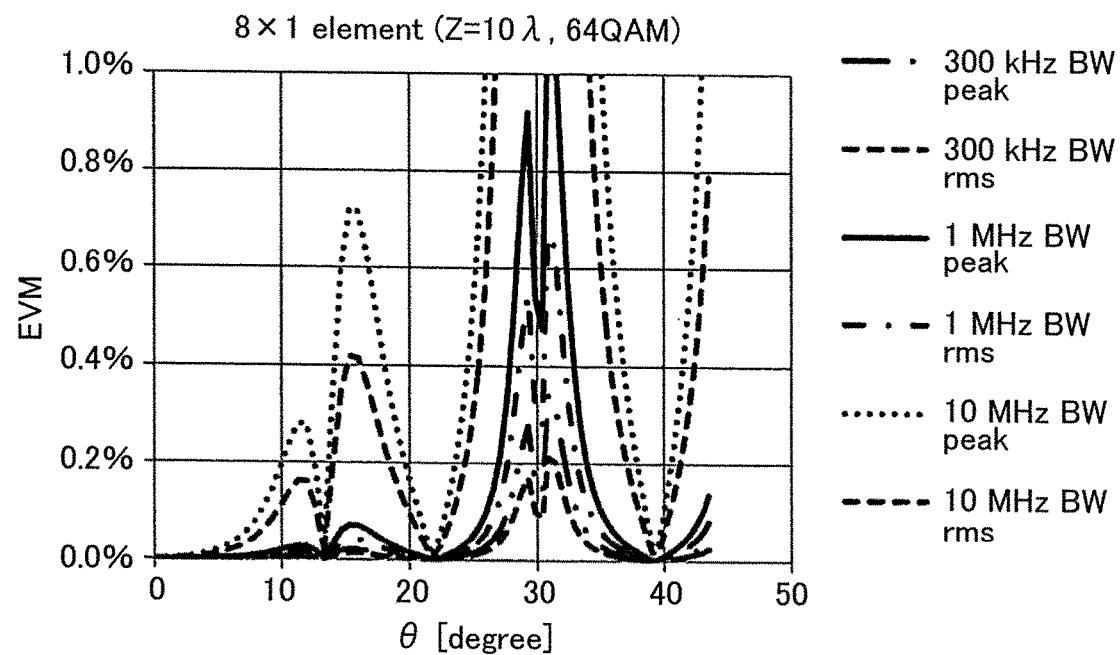

Similarly to FIG. 18A, FIG. 18B shows simulation results of the relationship between the angular deviation from the directivity center direction and the value of the residual EVM in the case where the position z on the z-axis of the probe 210 is $z=10\lambda_T$. Specifically, shown is the relationship of the residual EVM to the value of $\theta_0$ at the position $P_0(10\lambda_T \tan \theta_0, 0, 10\lambda_T)$, which is inclined by the angle $\theta_0$ from a position where the position z of the probe 210 on the z-axis is set to $z=10\lambda_T$. It can be seen that at $\theta_0=0$ degree corresponding to the beam directivity center, the values of the residual $EVM_{peak}$ and residual $EVM_{rms}$ are small, but when $\theta_0$ exceeds 25 degrees, the values of the residual $EVM_{peak}$ and residual $EVM_{rms}$ suddenly increase.

Figure 19A:
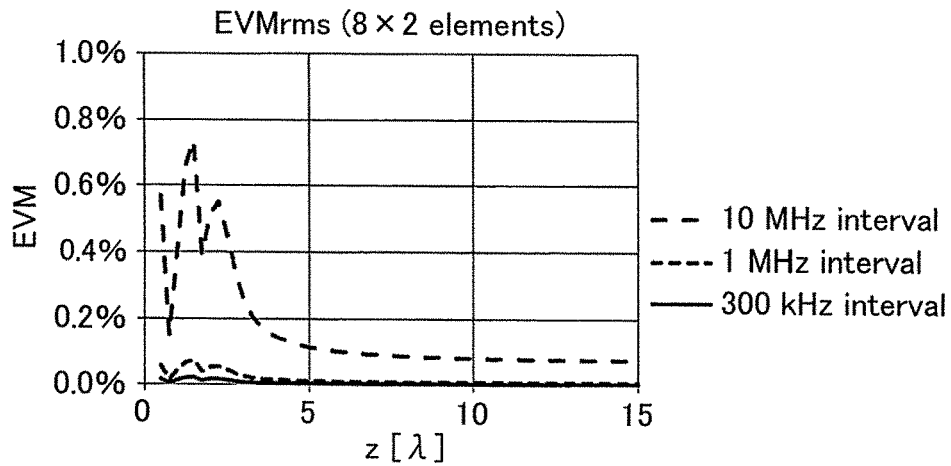
FIG. 19A shows the result of simulating probe position dependency of EVM when the array of the antenna elements is 8 rows×2 columns.
Figure 19B:
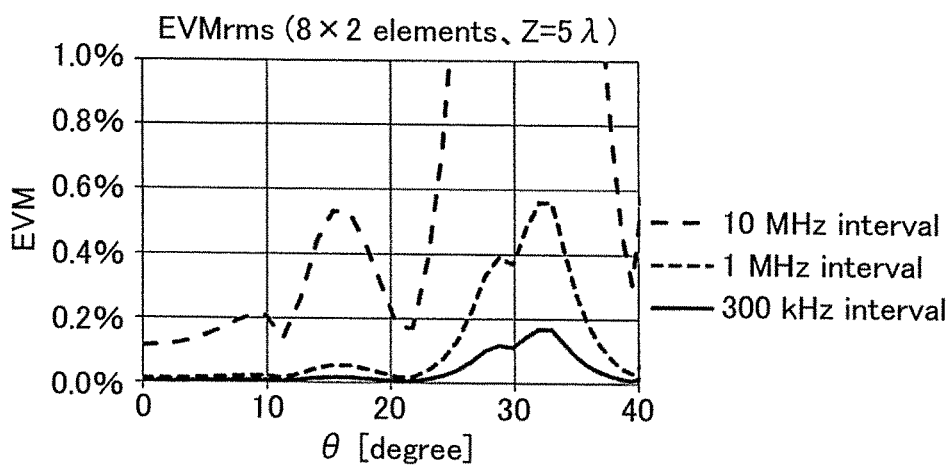
FIG. 19B and FIG. 19C are graphs showing the relationship between an angular deviation from the direction of the directivity center and EVM when the array of the antenna elements is 8 rows×2 columns.
Figure 19C:
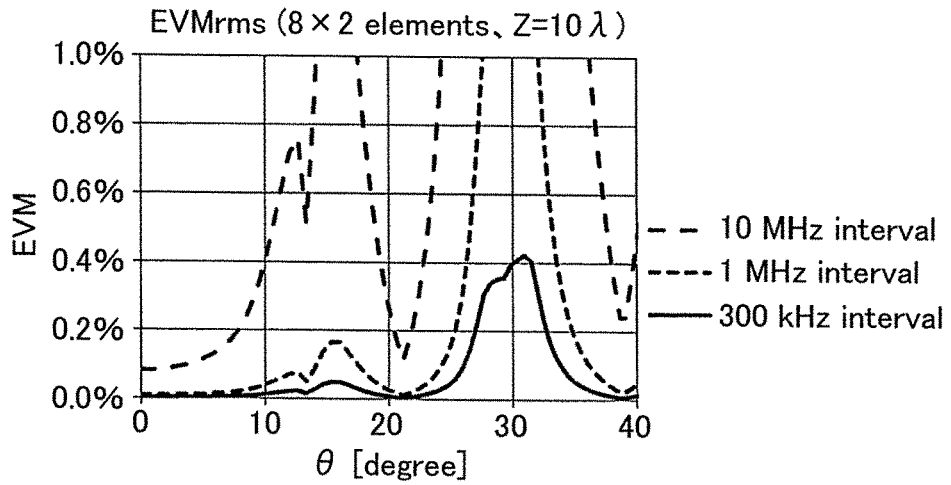

FIGS. 19A, 19B and 19C show the result of simulating the probe position dependence of the residual EVM in each case where the pilot subcarrier interval is 10 MHz, 1 MHz, and 300 kHz when the array of the antenna elements is 8 rows×2 columns. Specifically, the relationship between the value of the residual $EVM_{peak}$ of the signal transmitted from the array antenna 110 and the z-axis position of the probe 210 was simulated. In FIG. 19, the deviation in the phase direction due to the group delay distortion and the deviation in the amplitude direction are taken into consideration. The z-axis is normalized with $\lambda_T$. As shown in FIG. 19A, as the pilot subcarrier interval becomes wider, the residual EVM deteriorates. This tendency becomes more prominent as the z-component of the position $P_0(0, 0, z)$ of the probe 210 is smaller (in particular, the range of $z \leq 4\lambda$). As described above, the simulation does not consider the influence on the group delay distortion due to the multiple reflections due to the distance between the antennas. When the distance between the antennas is short, multiple reflections occur between the antennas and the combined multiple-reflected waves are received simultaneously with the transmitted waves from the antenna. Therefore, since combining the vectors makes the group delay distortion worse than when calculated in FIG. 19A, the result in FIG. 19A is deteriorated. Therefore, it is necessary to secure a distance not affected by the multiple reflections, based on the electromagnetic field simulation result of the actually used antenna.

FIG. 19B shows the result of simulating the relationship between the angular deviation from the directivity center and the residual EVM value in each case where the pilot subcarrier interval is 10 MHz, 1 MHz, and 300 kHz when the array of the antenna elements is 8 rows×2 columns. Specifically, shown is the relationship of the residual EVM to the value of $\theta_0$ at the position $P_0(5\lambda_T \tan \theta_0, 0, 5\lambda_T)$, which is inclined by the angle $\theta_0$ from a position where the position z of the probe 210 on the z-axis is set to $z=5\lambda_T$. It can be seen that at $\theta_0=0$ degree corresponding to the directivity center, the value of the residual EVM is small, but when $\theta_0$ exceeds 25 degrees, the value of the residual EVM suddenly increases.

FIG. 19C shows the result of simulating the relationship between the angular deviation from the directivity center and the residual EVM value in each case where the pilot subcarrier interval is 10 MHz, 1 MHz, and 300 kHz when the array of the antenna elements is 8 rows×2 columns, as in FIG. 19B. Specifically, shown is the relationship of the residual EVM to the value of $\theta_0$ at the position $P_0(10\lambda_T \tan \theta_0, 10\lambda_T)$, which is inclined by the angle $\theta_0$ from a position where the position z of the probe 210 on the z-axis is set to $z=10\lambda_T$. It can be seen that at $\theta_0=0$ degree corresponding to the directivity center, the value of the residual EVM is small, but when $\theta_0$ exceeds 10 degrees, the value of the residual EVM suddenly increases.

Experiment

Experimental results obtained by measuring the EVM or the like of the equipment under test (EUT) will be described.

Figure 20:
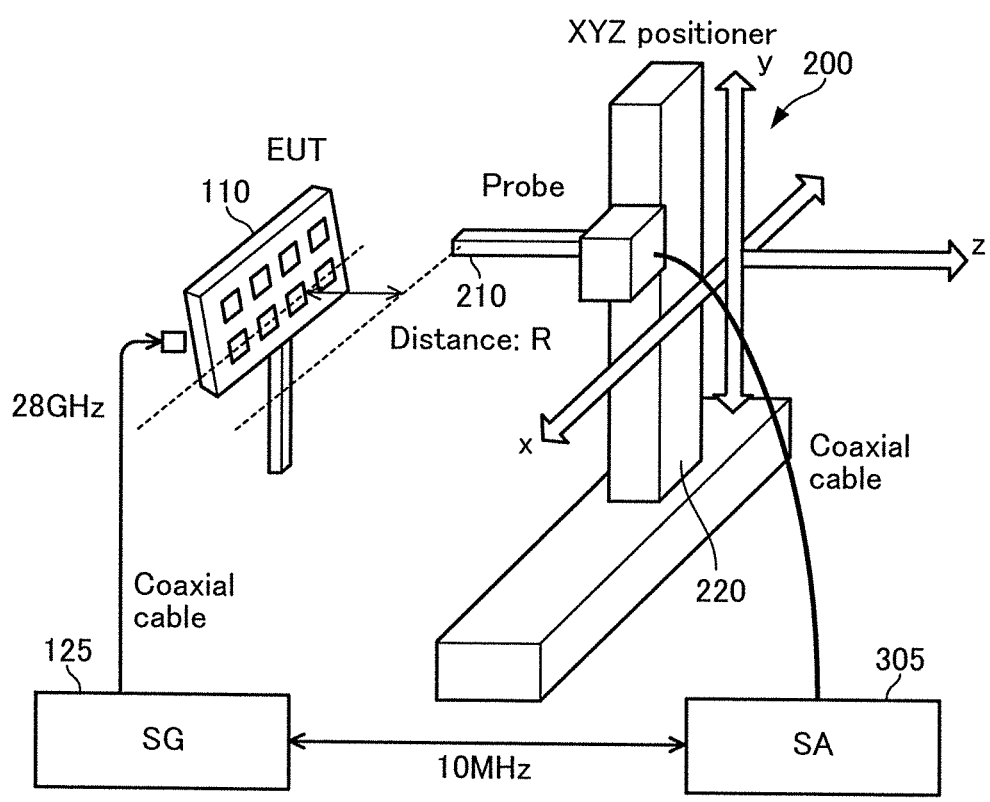
FIG. 20 is an explanatory diagram for explaining an experiment method.
Figure 21A:
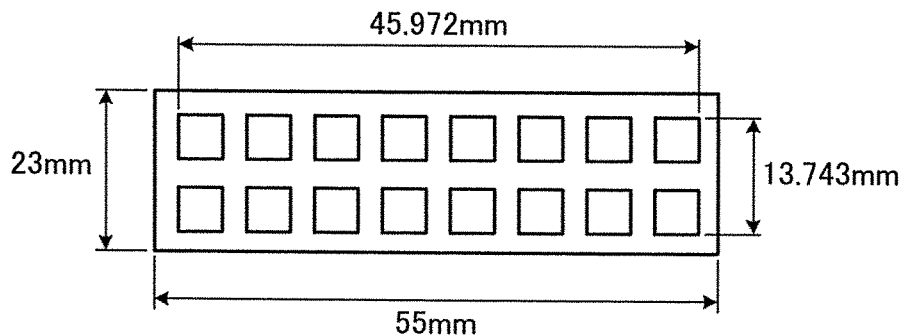
FIG. 21A is a diagram illustrating the configuration of an antenna that was used in working examples with the array of the antenna elements being 8 rows×2 columns.

FIG. 20 is an explanatory diagram for explaining the experimental method. The EUT was equipped with an array antenna 110 of 8 rows×2 columns as shown in FIG. 21A. The array antenna 110 was connected to a signal generator (SG) 125 via a coaxial cable. The probe 210 was attached to an XYZ positioner (movement device) 200 for positioning of the probe 210 in directions of three axes (X, Y, and Z axes). The probe 210 was connected to a receiver 305 via a coaxial cable. A signal analyzer (SA) was used as the receiver 305. A reference signal having a reference frequency of 10 MHz was shared in the signal generator 125 and the receiver 305.

The conditions of the experiment are as follows:
frequency: 28 GHz (wavelength $\lambda$: 10.7 mm)
waveform: V5G Downlink 64 QAM
bandwidth: 100 MHz
probe: WR-28
distance from EUT to probe (distance between antennas) R: $0.5\lambda$ to $15\lambda$
scan range of probe on x-axis: ±108.45 mm (±10$\lambda$)

Figure 21B:
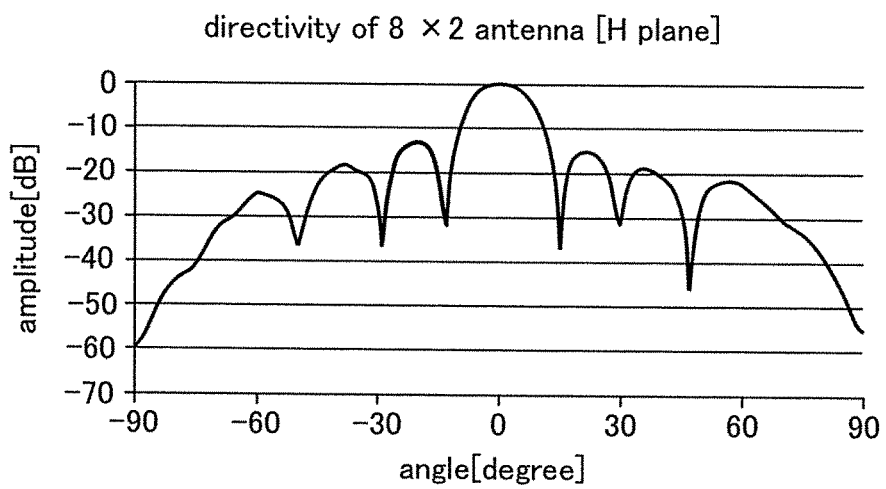
FIG. 21B and FIG. 21C are diagrams showing directivity that was measured in the working examples in the case where the array of the antenna elements is 8 rows×2 columns.
Figure 21C:
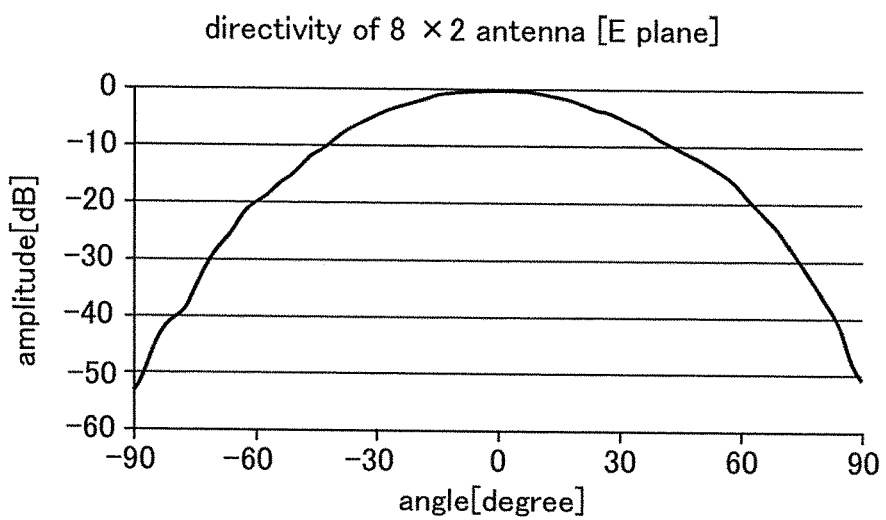

FIG. 21B is a graph showing a measurement result of the directivity on an H-plane in the case of the array antenna 110 of 8 rows×2 columns provided in the EUT. FIG. 21C is a graph showing a measurement result of the directivity on an E-plane in the case of the array antenna 110 of 8 rows×2 columns provided in the EUT. It was confirmed that the directivity direction ($\theta_0, \varphi_0$) was $\theta_0=0°$ and $\varphi_0=0°$.

Figure 22:
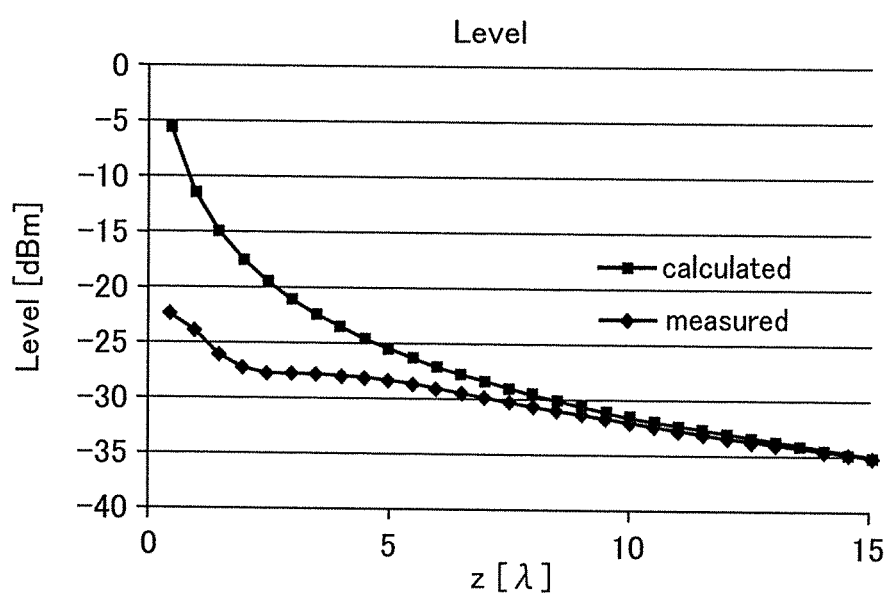
FIG. 22 is a graph showing probe position dependency of a reception level at a probe in the case where the array of the antenna elements is 8 rows×2 columns.

FIG. 22 is a graph showing a measurement result and a calculation result on the relationship between a reception level (received power) and a position on the z-axis of the probe 210. Generally, as the distance between the array antenna 110 serving as a transmission antenna and the probe 210 serving as a reception antenna is increased, signals radiated from each array element are incident on the probe in a state in which the phases of the waves are aligned. Accordingly, a curve obtained by multiplying the sum of voltages of components radiated from all the antenna elements by a free space loss gradually approaches a curve of the received power. That is, by increasing the distance R between the antennas, measurements can be performed while the phase difference from all the antenna elements can be ignored. At the same time, it can be said that the EVM of the signal radiated from each antenna element equally contributes to the measurement result.

Figure 23A:
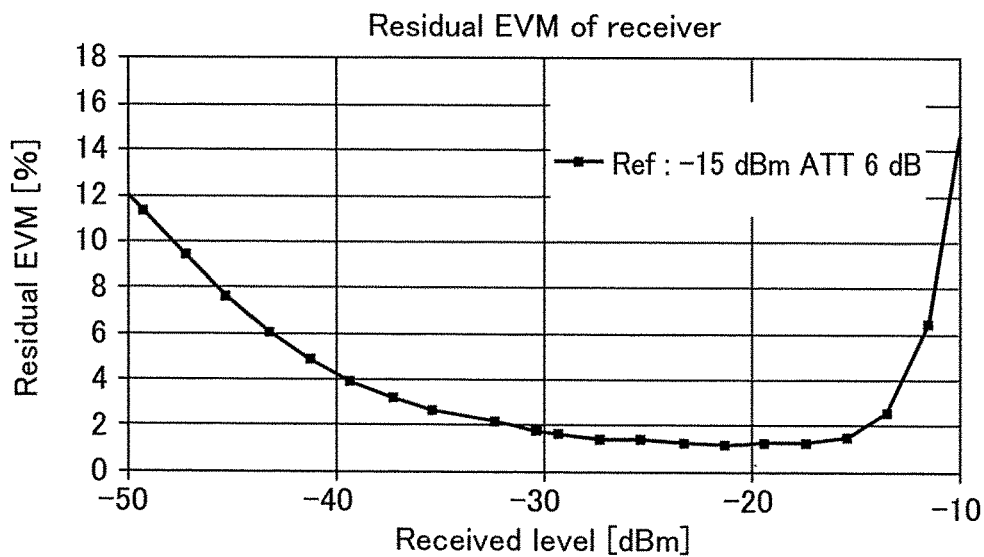
FIG. 23A shows the relationship between the input level at a receiver and the residual EVM at the receiver.

On the other hand, if the distance R between the array antenna 110 and the probe 210 increases, the reception level at the probe 210 decreases. FIG. 23A shows the relationship between the input level at the receiver 305 and the residual EVM at the receiver where the residual EVM of the reception system (receiver 305) becomes large as the reception level decreases. The residual EVM of the receiver also changes depending on measurement conditions. FIG. 23A shows the case where the reference level of the receiver is -15 dBm and the input attenuator is 6 dB.

Figure 23B:
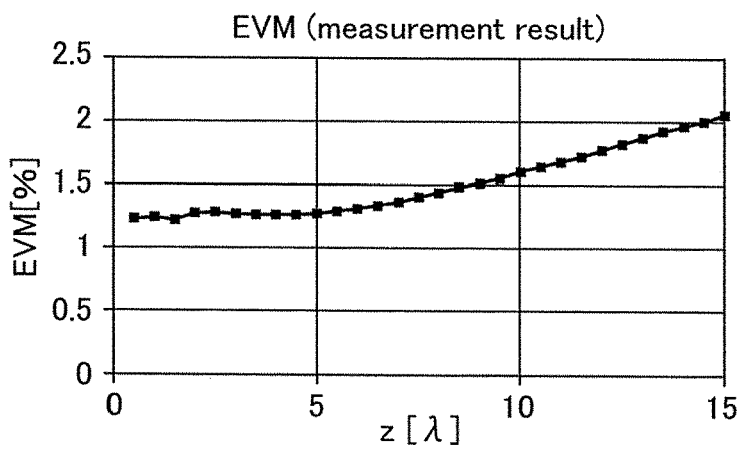
FIG. 23B shows the measurement result of the EVM.
Figure 23C:
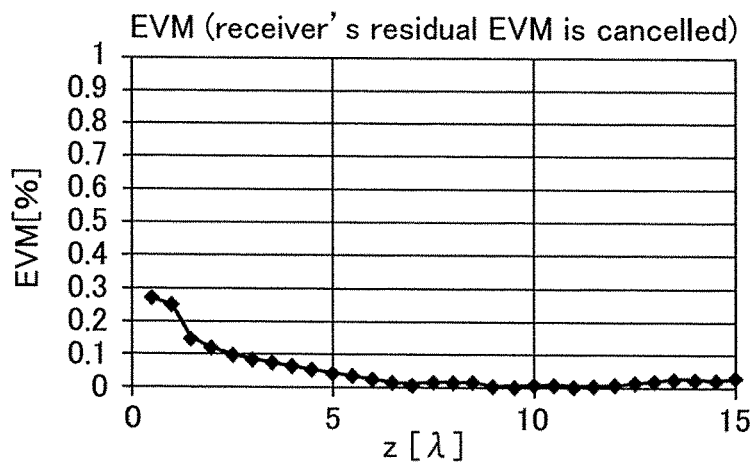
FIG. 23C shows the result obtained by calculation of subtracting the residual EVM shown in FIG. 23A of the receiving system from the result shown in FIG. 23B.

FIG. 23B is a graph showing the measurement result of the EVM. The horizontal axis of the graph indicates the position of the probe 210 on the z-axis, and the vertical axis indicates the EVM. The z-axis is normalized with $\lambda_T$. This measurement result includes the residual EVM of the receiver shown in FIG. 23 A. Since the transmission power at the base station is large, it is assumed that the level input to the receiver 305 can be sufficiently secured even if the distance R between the antennas is large. Accordingly, the EVM obtained by cancelling the residual EVM of the reception system will be discussed later. FIG. 23C shows the result obtained by subtracting the residual EVM of the reception system by calculation with reference to the reception level of FIG. 22.

From FIG. 23C, it has been confirmed that the EVM tends to asymptotically approach zero as the z-axis position of the probe 210 increases. From FIG. 23(c), it has been confirmed that the EVM tends to asymptotically approach 0 as the z-axis position of the probe 210 increases. The measurement results show the same tendency as FIG. 17A which is the result of simulating the residual EVM due to the group delay caused by the fact that the path length from each antenna element of the array antenna 110 to the probe 210 is different. On the other hand, the numerical value is worse than the simulation result, which is considered to be due to the effect of multiple reflections between the antennas.

Figure 24:
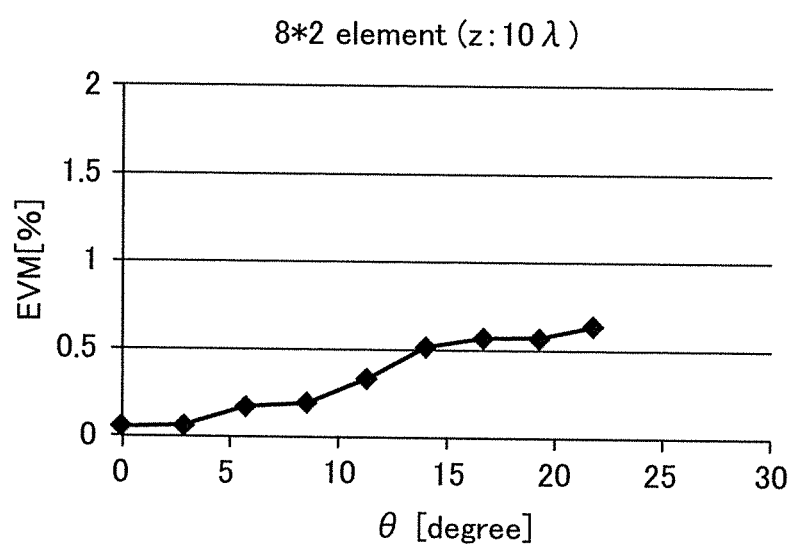
FIG. 24 is a graph showing the relationship between an angular deviation from the direction of the directivity center and an EVM in the case where the array of the antenna elements is 8 rows×2 columns.

FIG. 24 shows the measurement result of the EVM with respect to the angular deviation from the directivity center direction of the probe 210 in the case of the array antenna 110 of 8 rows×2 columns. The z-axis position of the probe 210 was set to 10λ. It has been confirmed from FIG. 24 that as the probe 210 deviates from a directivity center, the EVM deteriorates. Accordingly, the same result as the simulation result of FIG. 18B was obtained.

Second Embodiment

Figure 25:
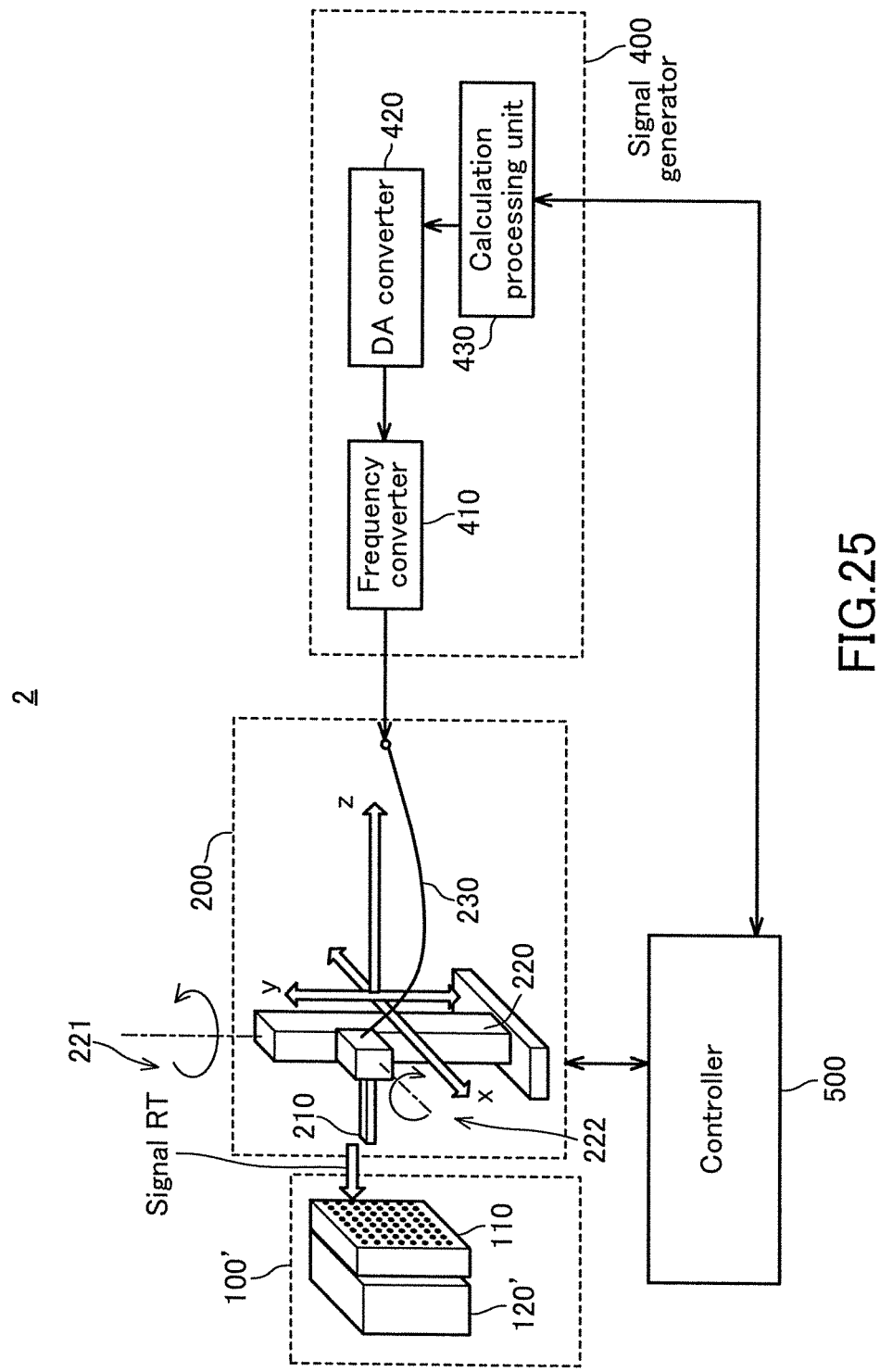
FIG. 25 is a block diagram illustrating an antenna device according to a second embodiment.

The second embodiment of the present invention will be described. FIG. 25 shows the configuration of an antenna device 2 according to the second embodiment of the present invention.

The antenna device 2 is configured to generate a signal for transmitting a radio signal RT (first modulated signal) modulated in a millimeter-wave-band to the array antenna 110 of equipment under test (EUT) 100' by the probe 210 having a function of a transmission antenna provided in the movement device 200. The transmitted signal is received by each antenna element of the array antenna 110, and a reception sensitivity is analyzed by a receiver 120'. The radio signal RT is an OFDM modulated signal and is a multicarrier signal having a center frequency of 28 GHz and a pilot subcarrier interval in the range of 300 kHz to 100 MHz. A signal generator 400 generates a transmission signal, and the controller 500 controls the movement device 200 and the signal generator 400.

The EUT 100' has the array antenna 110 as an antenna to be measured and a receiver 120' connected to the array antenna 110. As described above, the array antenna 110 is a planar array antenna in which a plurality of antenna elements $T_{ij}$ are arranged vertically and horizontally at equal intervals (see FIG. 2).

Figure 26:
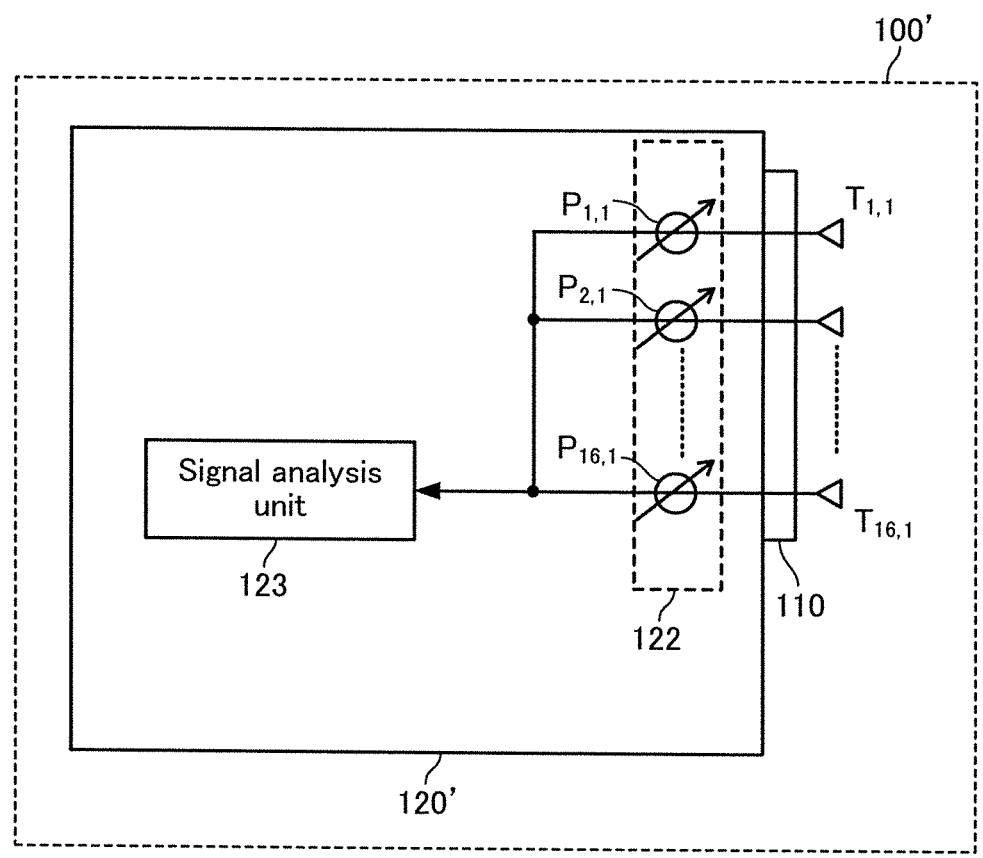
FIG. 26 is a diagram illustrating the detailed configuration of equipment under test (EUT) according to the second embodiment.

FIG. 26 shows the detailed configuration of the array antenna 110 and the receiver 120' of the EUT 100'. The array antenna 110 has the antenna elements $T_{1,1}$, $T_{2,1}$, ..., $T_{16,1}$, ..., $T_{16,16}$. The array antenna 110 is connected to the receiver 120', and the receiver 120' has a signal analysis unit 123, and a phase shifting unit 122 that includes the phase shifters $P_{1,1}$, $P_{2,1}$, ..., $P_{16,16}$. Since only one-dimensional arrangement is described in FIG. 26, descriptions of $T_{1,2}$, ..., $T_{16,16}$ and $P_{1,2}$, ..., $P_{16,16}$ are omitted.

The signal analysis unit 123 is connected to each of the phase shifters $P_{1,1}$, $P_{2,1}$, ..., $P_{16,16}$ of the phase shifting unit 122, and the phase shifters $P_{1,1}$, $P_{2,1}$, ..., $P_{16,16}$ are respectively connected to the antenna elements $T_{1,1}$, $T_{2,1}$, ..., $T_{16,16}$. Signals received by the antenna elements $T_{1,1}$, $T_{2,1}$, ..., $T_{16,16}$ are respectively input to the phase shifters $P_{1,1}$, $P_{2,1}$, ..., $P_{16,16}$ of the phase shifting unit 122, which shifts the phase values according to the phase shift amounts set in the phase shifters. The phase-shifted reception signals are input to the signal analysis unit 123. The signal analysis unit 123 demodulates the input reception signal and calculates a bit error rate, thereby evaluating the reception sensitivity.

It is noted that the phase shifters $P_{1,1}$, $P_{2,1}$, ..., $P_{16,16}$ may be provided in the array antenna 110 and integrated with the array antenna 110, or the phase may be adjusted at the intermediate frequency or baseband in the signal analysis unit.

Since the movement device 200 shown in FIG. 25 is the same as that of the first embodiment, the detailed description thereof will be omitted.

The cable 230 is connected to the signal generator 400, and a high frequency signal from the signal generator 400 is propagated to the probe 210 through the cable 230.

The signal generator 400 generates a transmission signal for measuring the reception sensitivity of the EUT 100' provided with the array antenna 110. The signal generated by the signal generator 400 is transmitted to the array antenna 110 via the probe 210. The signal generator 400 includes a frequency converter 410 which is an up-converter, a digital-to-analog (DA) converter 420, and a calculation processing unit 430.

Figure 27:
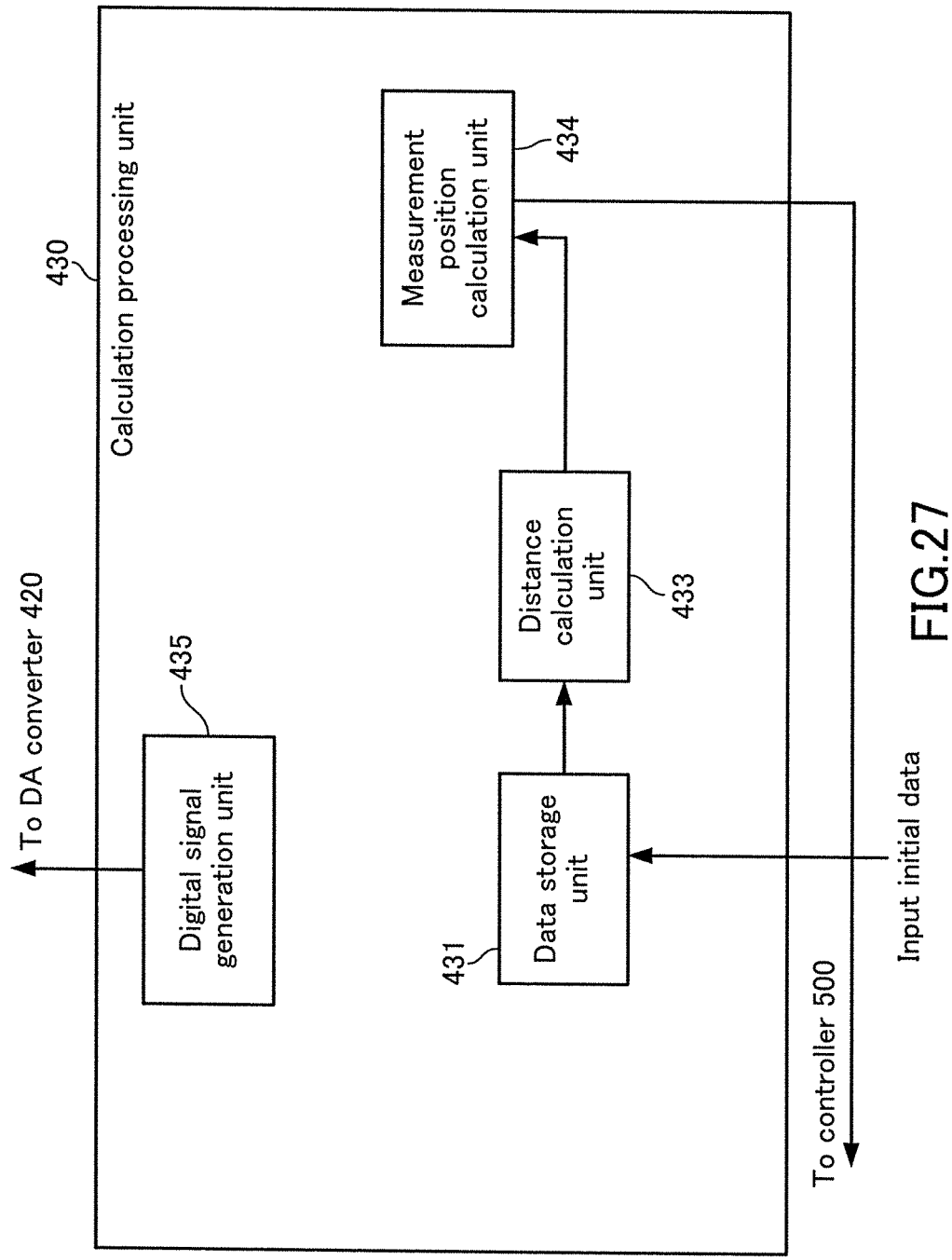
FIG. 27 is a diagram illustrating the detailed configuration of a calculation processing unit included in a signal generator according to the second embodiment.

FIG. 27 shows the configuration of the calculation processing unit 430. The calculation processing unit 430 includes a data storage unit 431, a directivity calculation unit 432, a distance calculation unit 433, a measurement position calculation unit 434, and a digital signal generation unit 435.

The data storage unit 431, the distance calculation unit 433, and the measurement position calculation unit 434 of the calculation processing unit 430 respectively correspond to the data storage unit 333, the distance calculation unit 334, and the measurement position calculation unit 335. Accordingly, the detailed description thereof will be omitted.

The digital signal generation unit 435 included in the calculation processing unit 430 calculates or generates digital data used for generating a baseband signal or an IF signal in an intermediate frequency bandwidth, and outputs the calculated digital data as a digital signal to the DA converter 420. The digital signal input to the DA converter 420 is converted into an analog signal, and is output to the frequency converter 410. The frequency converter 410 up-converts the analog signal to a high frequency bandwidth signal by the input baseband-signal or the IF analog signal having the intermediate frequency bandwidth and the up-converted signal is output to the probe 210.

According to the simulation result of FIG. 8 described above, the difference in the contribution ratio is within 1 dB when $z=2\lambda_T$ in the case of 4 rows×1 column, when $z=8\lambda_T$ in the case of 8 rows×1 column, and when $z=32\lambda_T$ in the case of 16 rows×1 column elements. In these cases, all the antenna elements can receive signals of almost the same level, so that these z values can be used as a criterion. In the case where a value of z is smaller than these z values, if the antenna elements and the probe 210 are extremely close to each other, the reception level at a part of the antenna elements rises, but the reception level at an outer part of the antenna elements falls, whereby the performance is evaluated only with the signal incident on the antenna elements near the center. For this reason, the characteristics of the EUT 100' cannot be accurately evaluated.

That is, consideration should be given to both the position $P_0(0, 0, z)$ of the probe 210 where the influence of the group delay distortion is reduced and the measurement result of the reception level difference. Actually, a distance between the array antenna 110 and the probe 210 is selected such that a desired group delay distortion can be achieved according to the pilot interval of OFDM. Taking this simulation result into account, it can be said that it is possible to measure the reception sensitivity in the near field with $z \geq 2\lambda_T$ in the case of 4 rows×1 column, $z \geq 8\lambda_T$ in the case of 8 rows×1 column, and $z \geq 32\lambda_T$ in the case of 16 rows×1 column.

Furthermore, as described above, it is also necessary to secure an optimum distance for reducing the influence of multiple reflections.

Therefore, the antenna device 2 according to the present embodiment makes it possible to generate a signal for measuring the reception sensitivity of the array antenna 110 to be measured in the near field without using a large-sized anechoic chamber.

Figure 28:
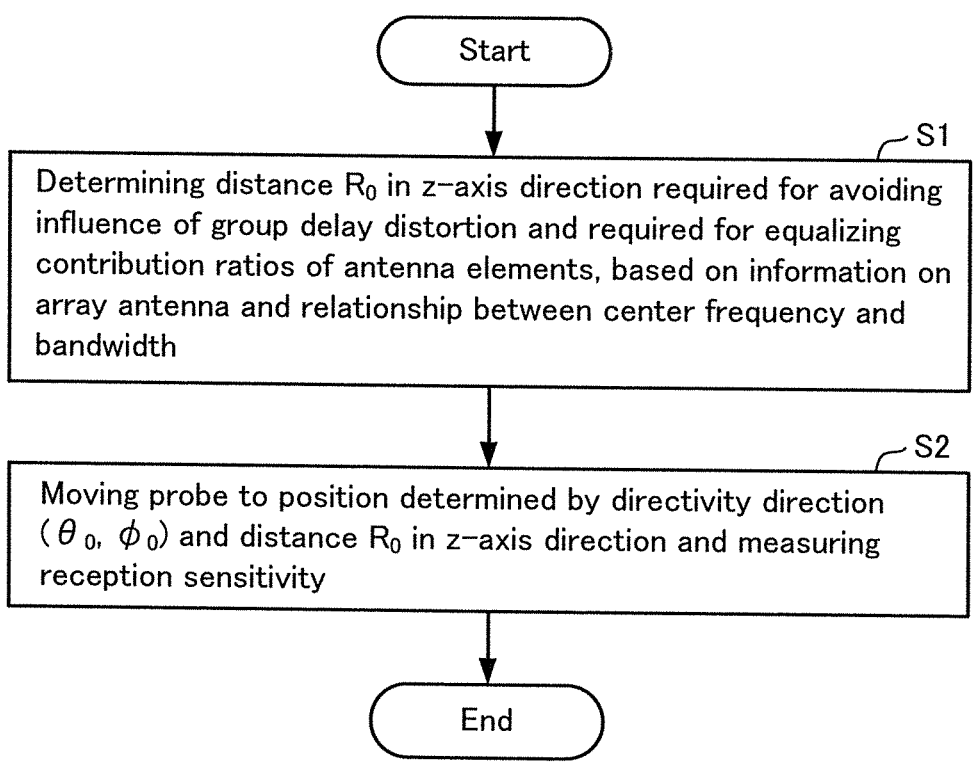
FIG. 28 is a flowchart showing signal generation processing by the signal generator according to the second embodiment.

A signal transmission method for determining the reception sensitivity using the antenna device 2 of the second embodiment will be described with reference to the flowchart of FIG. 28. From the information regarding the center frequency of the array antenna 110 and the bandwidth of the modulated signal, a distance $R_0$ in the z-axis direction, which is required for avoiding the influence of the group delay distortion and for equalizing the contribution rates of the antenna elements, is determined (step S1).

Next, the probe is moved to a position that is defined by the distance $R_0$ determined in the step S1 and by the directivity center direction $(\theta_0, \varphi_0)$ which corresponds to a maximum radiation direction, and then the reception sensitivity is measured (step S2).

Third Embodiment

Figure 29:
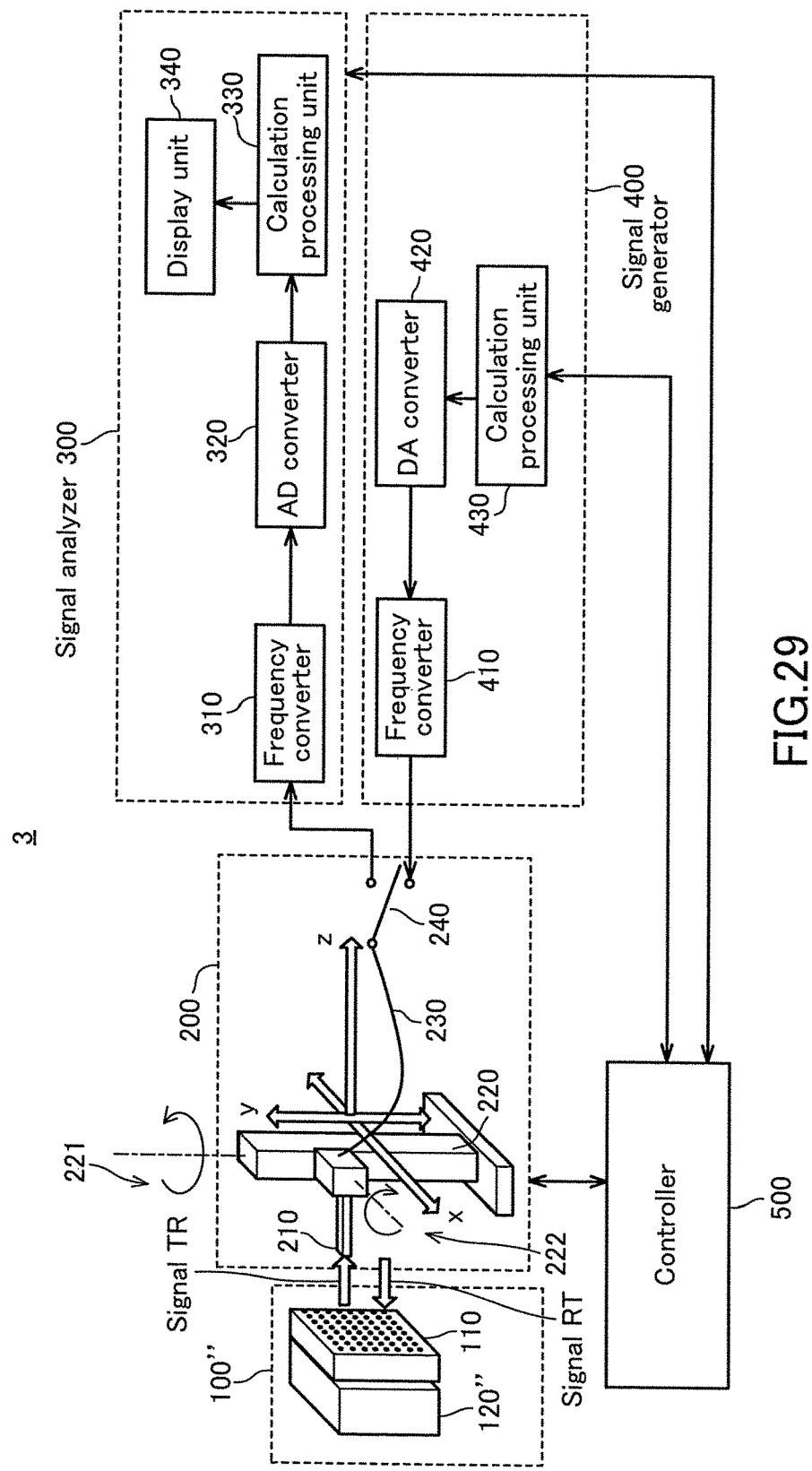
FIG. 29 is a block diagram illustrating an antenna device according to a third embodiment.

The third embodiment will be described. FIG. 29 shows the configuration of an antenna device 3 according to the third embodiment. The same components as those of the first embodiment and the second embodiment are denoted by the same reference numerals, and the detailed description thereof will be omitted.

As shown in FIG. 29, the antenna device 3 includes the probe 210, the movement device 200, the controller 500, a changeover switch 240, the signal analyzer 300, and the signal generator 400. The probe 210 has functions as a receiving antenna and a transmitting antenna. Switching the changeover switch 240 makes it possible to connect the probe 210 to either the signal analyzer 300 side or the signal generator 400 side.

The configuration of the signal analyzer 300 is the same as that of the first embodiment, and the signal generator 400 is the same as that of the second embodiment. Accordingly, the detailed description thereof will be omitted. The controller 500 controls operations of the movement device 200, the signal analyzer 300, and the signal generator 400.

Figure 30:
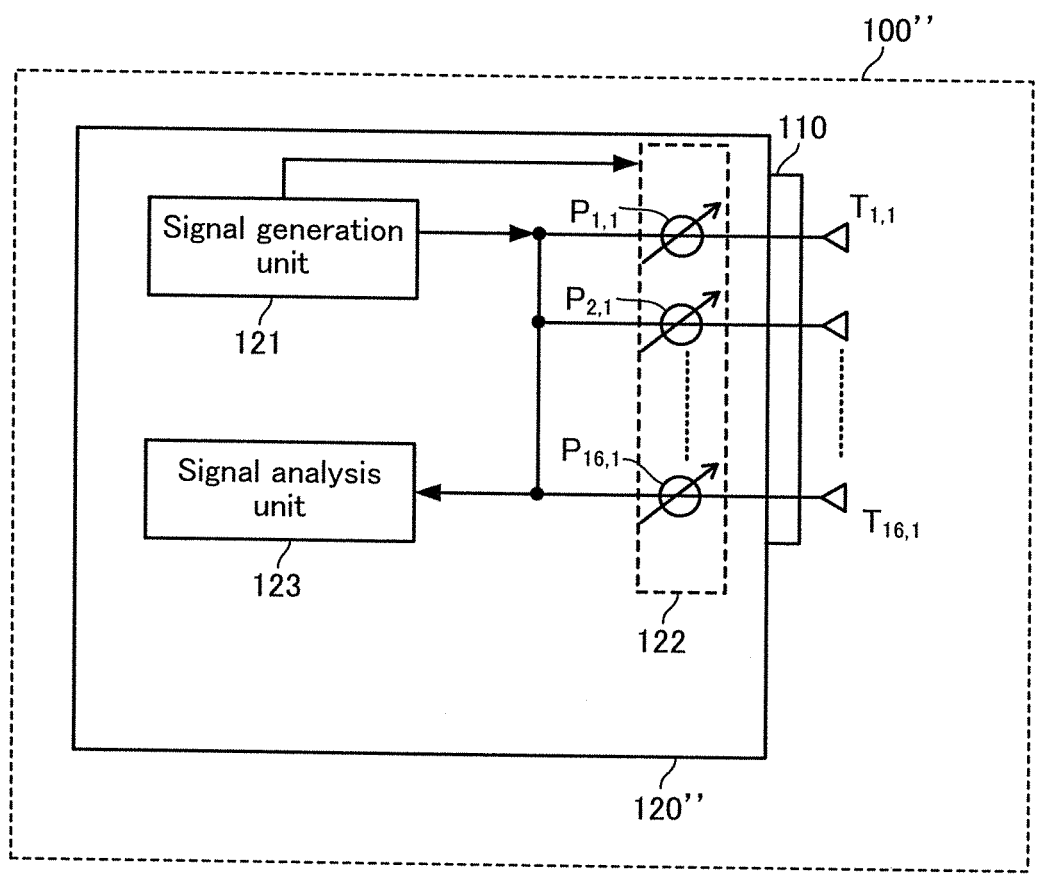
FIG. 30 is a diagram illustrating the detailed configuration of an EUT according to the third embodiment.

FIG. 30 shows the configuration of equipment under test (EUT) 100" provided with the array antenna 110 to be measured. The EUT 100" includes the array antenna 110 and a transmitter-receiver 120". The array antenna 110 can be used as an antenna for transmission and reception. The transmitter-receiver 120" has a signal generation unit 121 and a signal analysis unit 123.

Figure 31:
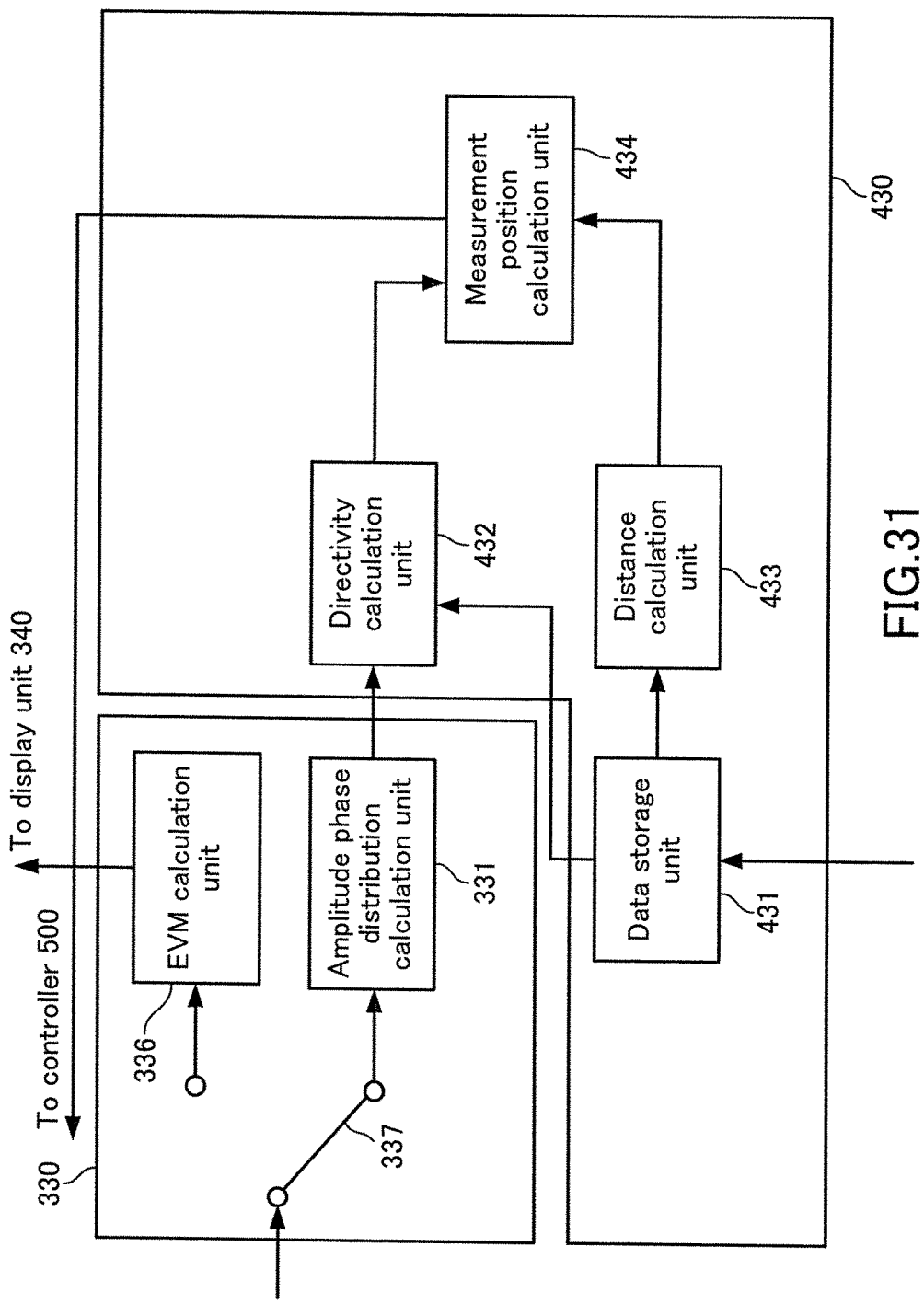
FIG. 31 is a diagram illustrating the configuration of a calculation processing unit included in a signal analyzer and a calculation processing unit included in a signal generator of the antenna device according to the third embodiment.

FIG. 31 is, a diagram showing the configuration of the calculation processing unit 330 of the signal analyzer 300 and the calculation processing unit 430 of the signal generator 400 in the antenna device 3 according to the third embodiment. As shown in FIG. 31, the calculation processing unit 330 of the signal analyzer 300 includes an amplitude phase distribution calculation unit 331, an EVM calculation unit 336, and a switch 337. The calculation processing unit 430 of the signal generator 400 includes a data storage unit 431, a directivity calculation unit 432, a distance calculation unit 433, and a measurement position calculation unit 434. Since the function of each of the above-described units is the same as that of the corresponding unit of the first embodiment, the detailed explanation thereof will be omitted.

When the EVM of a radio signal TR (first modulated signal) transmitted from the array antenna 110 of the EUT 100" is measured, the changeover switch 240 of the antenna device 3 according to the third embodiment is switched to the signal analyzer 300 side. When the reception sensitivity of the array antenna 110 of the EUT 100" is measured using the radio signal RT (second modulated signal) transmitted from the probe 210, the changeover switch 240 is switched to the signal generator 400 side.

Figure 32:
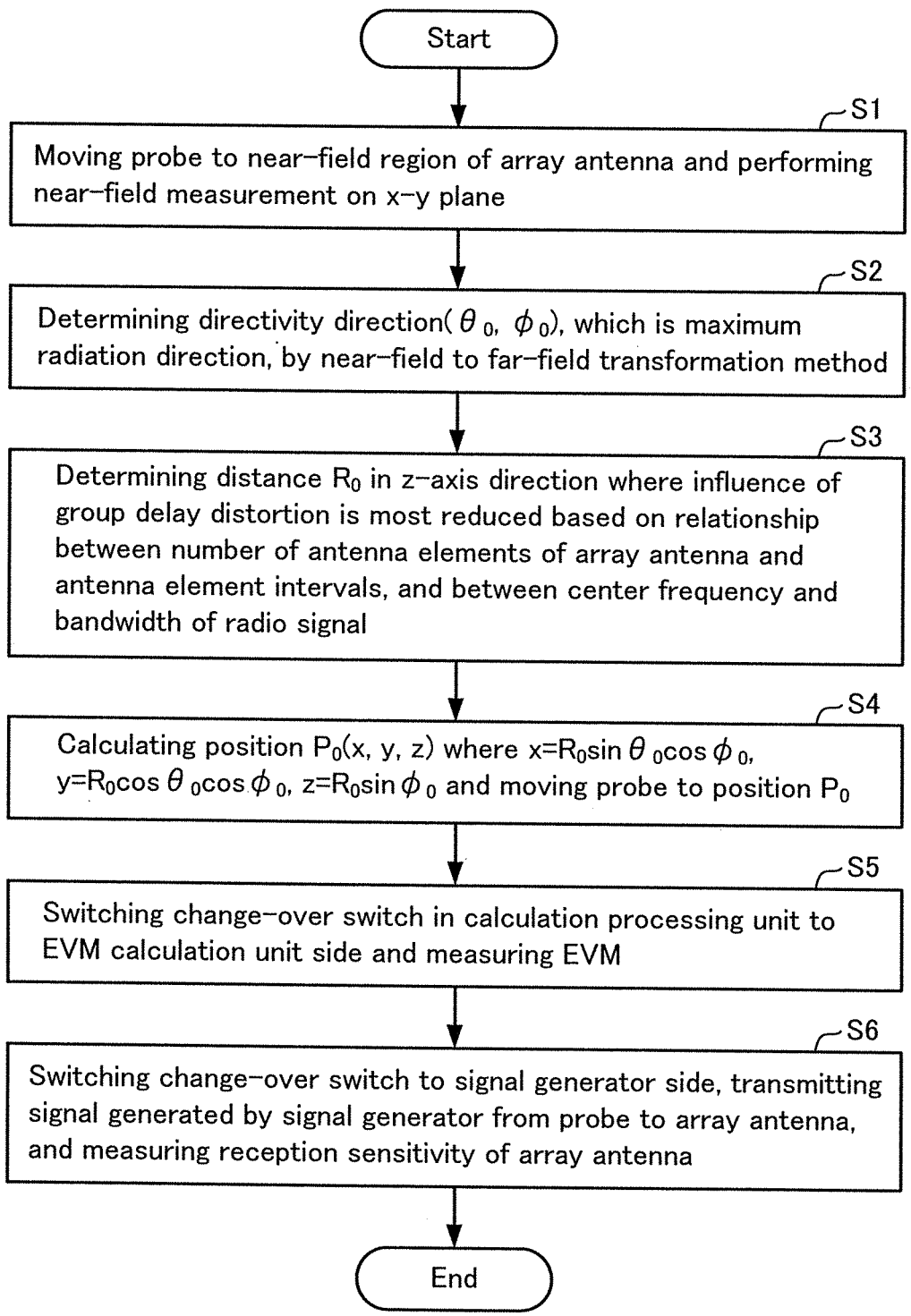
FIG. 32 is a flowchart showing processing of a measurement method by the antenna device according to the third embodiment.

The measurement method according to the third embodiment will be described with reference to the flowchart of FIG. 32.

First, the near-field measurement of a radio signal transmitted from the array antenna 110 is performed. Specifically, the probe 210 is moved to a range of the near-field region on the z-axis by the movement device 200, and an x-y plane that is a plane facing the array antenna 110 is scanned with the probe 210 to measure the amplitude and phase at a plurality of positions in the x-y plane in the near field (step S1).

Next, using the amplitude distribution and the phase distribution in the near field obtained in the step S1, the directivity center direction $(\theta_0, \varphi_0)$ which corresponds to a maximum radiation direction is determined by the near-field to far-field transformation method such as a known fast Fourier transform (step S2).

The distance $R_0$ in the z-axis direction where the influence of the group delay distortion is reduced is determined based on information regarding the number of the antenna elements of the array antenna 110 and the antenna element intervals, and information regarding the center frequency and the bandwidth (pilot carrier interval) of the modulated radio signal TR (step S3). This step S3 may be performed before or after the step S1. Further, $R_0$ may satisfy the condition that the contribution ratios of the antenna elements of the array antenna 110 can be equalized with one another and the condition that the decrease in S/N ratio due to an increase in the distance between the array antenna 110 and the probe 210 can be avoided. If the distance $R_0$ satisfies these conditions, EVM can be measured more accurately.

The measurement position $P_0$ (x, y, z) defined by $x=R_0 \sin\theta_0 \cos\varphi_0$, $y=R_0 \cos\theta_0 \cos\varphi_0$, $z=R_0 \sin\varphi_0$ is calculated based on the directivity center direction $(\theta_0, \varphi_0)$ determined in the step S2 and the distance $R_0$ determined in the step S3, and then the probe 210 is moved to this measurement position $P_0$ (step S4).

The switch 337 in the calculation processing unit 330 is switched to the EVM calculation unit 336 side, and the EVM calculation unit 336 determines the EVM based on the signal received by the probe 210 (step S5).

Next, the changeover switch 240 is switched to the signal generator 400 side, and a signal transmitted from the probe 210 at the same position as the position where the EVM measurement was performed is received by the array antenna 110 to determines the reception sensitivity (step S6).

The measurement method using the antenna device 1 according to the first embodiment may be conducted by performing the steps S1 to S5.

As described above, according to the present invention, it is possible in the range of the near-field measurement to measure the EVM and the reception sensitivity with regard to the antenna to be measured, so that the size of the measurement environment can be reduced. Therefore, the present invention is useful for all the arts related to the antenna device and the measurement method.

Further, the antenna device of the present invention is characterized by including a rotation mechanism for tilting the probe at the directivity center of the array antenna according to the directivity of the signal radiated from the array antenna, whereby the EVM can be measured while reducing the propagation loss even when the array antenna has directivity and the directivity center of the array antenna deviates from the z-axis.

Furthermore, according to the present invention, it is possible to reduce the residual EVM by the measurement system and to perform the EVM measurement in the region of the near-field measurement.

What is claimed is:

1. An antenna device used for evaluating a transmission characteristic or a reception characteristic of equipment under test (EUT) having an array antenna that comprises a plurality of antenna elements arranged in a plane at predetermined intervals, the antenna device comprising
an antenna for receiving a modulated signal radiated by the EUT via the array antenna or radiating the modulated signal to the array antenna,
wherein the antenna is disposed at a position on a z-axis perpendicular to the plane defined by the plurality of antenna elements such that a group delay distortion of the modulated signal is reduced in a near-field region.

2. The antenna device according to claim 1, further comprising: a movement device for moving the antenna in the direction of the z-axis; and a controller for moving the antenna to the position.

3. The antenna device according to claim 2, further comprising a signal analyzer for determining an Error Vector Magnitude (EVM) of the modulated signal which was transmitted by the EUT and received by the antenna at the position where the group delay distortion was reduced.

4. The antenna device according to claim 3, further comprising: a data storage unit for storing information regarding the antenna to be measured and the modulated signal; and a distance calculation unit for calculating, based on the information stored in the data storage unit, a distance in a z-axis direction where the influence of the group delay distortion is reduced,
wherein the distance calculated by the distance calculation unit is output to the controller.

5. The antenna device according to claim 2, further comprising a signal generator for generating the modulated signal for evaluating the reception characteristic of the EUT,
wherein the modulated signal generated by the signal generator is radiated to the EUT via the antenna disposed at the position where the group delay distortion is reduced, and the EUT receives the modulated signal radiated via the antenna and calculates a reception sensitivity of the modulated signal received by the EUT.

6. The antenna device according to claim 5, further comprising: a data storage unit for storing information regarding the antenna to be measured and the modulated signal; and a distance calculation unit for calculating, based on the information stored in the data storage unit, a distance in a z-axis direction where the influence of the group delay distortion is reduced,
wherein the distance calculated by the distance calculation unit is output to the controller.

7. The antenna device according to claim 1, further comprising a signal analyzer for determining an Error Vector Magnitude (EVM) of the modulated signal which was transmitted by the EUT and received by the antenna at the position where the group delay distortion was reduced.

8. The antenna device according to claim 7, wherein the signal analyzer comprises:
a frequency converter for converting the modulated signal received by the antenna into a low frequency signal;
an analog-to-digital (AD) converter for digitizing the low frequency signal which was frequency-converted by the frequency converter; and
a calculation processing unit which comprises an EVM calculation unit for calculating the EVM based on the signal digitized by the AD converter.

9. The antenna device according to claim 7, further comprising a signal generator for generating the modulated signal for evaluating the reception characteristic of the EUT,
wherein the modulated signal generated by the signal generator is radiated to the EUT via the antenna disposed at the position where the group delay distortion is reduced, and the EUT receives the modulated signal radiated via the antenna and calculates a reception sensitivity of the modulated signal received by the EUT.

10. The antenna device according to claim 9, further comprising a switch for switching between the signal generator and the signal analyzer.

11. The antenna device according to claim 9,
wherein the movement device is also movable in mutually perpendicular x- and y-axis directions forming an x-y plane parallel to the plane defined by the plurality of antenna elements,
wherein the antenna device further comprises
a data storage unit for storing information regarding the antenna to be measured and the modulated signal,
a distance calculation unit for calculating, based on the information stored in the data storage unit, a distance in a z-axis direction where the influence of the group delay distortion is reduced,
an amplitude phase calculation unit for calculating amplitude and phase distributions of the modulated signal radiated from the array antenna by scanning the near-field region with the antenna in the x-axis direction and the y-axis direction,
a directivity calculation unit for calculating the directivity of the array antenna based on the amplitude and phase distributions, and
a position calculation unit for calculating, based on the directivity and the distance in the z-axis direction, the position where the influence of the group delay distortion is reduced also in view of the directivity, and
wherein the antenna is moved to the position calculated by the position calculation unit, and the antenna receives the modulated signal to determine the EVM.

12. The antenna device according to claim 7,
wherein the movement device is also movable in mutually perpendicular x- and y-axis directions forming an x-y plane parallel to the plane defined by the plurality of antenna elements,
wherein the antenna device further comprises
    a data storage unit for storing information regarding the antenna to be measured and the modulated signal,
    a distance calculation unit for calculating, based on the information stored in the data storage unit, the distance in a z-axis direction where the influence of the group delay distortion is reduced,
    an amplitude phase calculation unit for calculating amplitude and phase distributions of the modulated signal radiated from the array antenna by scanning the near-field region with the antenna in the x-axis direction and the y-axis direction,
    a directivity calculation unit for calculating the directivity of the array antenna based on the amplitude and phase distributions, and
    a position calculation unit for calculating, based on the directivity and the distance in the z-axis direction, the position depending where the influence of the group delay distortion is reduced also in view of the directivity, and
wherein the antenna is moved to the position calculated by the position calculation unit, and the antenna receives the modulated signal to determine the EVM.

13. The antenna device according to claim 12, wherein the movement device comprises a rotation mechanism for rotating the antenna to a position that is a center of the directivity of the array antenna in accordance with the directivity of the modulated signal calculated by the directivity calculation unit.

14. The antenna device according to claim 1, further comprising a signal generator for generating the modulated signal for evaluating the reception characteristic of the EUT,
    wherein the modulated signal generated by the signal generator is radiated to the EUT via the antenna disposed at the position where the group delay distortion is reduced, and the EUT receives the modulated signal radiated via the antenna and calculates a reception sensitivity of the modulated signal received by the EUT.

15. The antenna device according to claim 14, wherein the signal generator comprises:
    a digital signal generation unit for performing calculation of digital data of the modulated signal radiated to the EUT and generating a digital signal;
    a digital-to-analog (DA) converter for converting the digital signal generated by the digital signal generation unit into an analog signal; and
    a frequency converter for converting the analog signal into the modulated signal having a desired frequency.

16. The antenna device according to claim 1, further comprising: a data storage unit for storing information regarding the antenna to be measured and the modulated signal; and a distance calculation unit for calculating, based on the information stored in the data storage unit, the distance in a z-axis direction where the influence of the group delay distortion is reduced,
    wherein the distance calculated by the distance calculation unit is output to the controller.

17. The antenna device according to claim 1, wherein the antenna is disposed at the position where the antenna receives the signals radiated from each antenna element included in the array antenna in nearly equivalent levels.

18. A measurement method used for evaluating a transmission characteristic or a reception characteristic of equipment under test (EUT) having an array antenna that comprises a plurality of antenna elements arranged in a plane at predetermined intervals, the measurement method comprising:
    a step in which an antenna receives a modulated signal radiated by the EUT via the array antenna or radiates the modulated signal from the antenna to the array antenna,
    a movement step of moving the antenna in a z-axis direction perpendicular to the plane defined by the plurality of antenna elements, and
    during the movement step, a control step of controlling such that the antenna is moved to a position where a group delay distortion of the modulated signal is reduced in a near-field region.

19. The measurement method according to claim 18, further comprising a signal analysis step of determining an Error Vector Magnitude (EVM) of the modulated signal which was transmitted from the EUT and received by the antenna at the position where the group delay distortion was reduced.

20. The measurement method according to claim 18, further comprising a signal generation step of generating the modulated signal for evaluating the reception characteristic of the EUT,
    wherein the modulated signal generated in the signal generation step is radiated to the EUT via the antenna disposed at the position where the group delay distortion is reduced, and the EUT receives the modulated signal radiated via the antenna and calculates a reception sensitivity of the modulated signal received by the EUT.

* * * * *